United States Patent
Ono et al.

(10) Patent No.: US 10,459,003 B2
(45) Date of Patent: Oct. 29, 2019

(54) SIGNAL DETECTION METHOD FOR CAPACITANCE DETECTION TYPE SENSOR, MEMS SENSOR, AND SYSTEM

(71) Applicant: HITACHI AUTOMOTIVE SYSTEMS, LTD., Ibaraki (JP)

(72) Inventors: Kazuo Ono, Tokyo (JP); Daisuke Maeda, Tokyo (JP); Takashi Oshima, Tokyo (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 89 days.

(21) Appl. No.: 15/554,186

(22) PCT Filed: Mar. 17, 2016

(86) PCT No.: PCT/JP2016/058580
§ 371 (c)(1),
(2) Date: Aug. 28, 2017

(87) PCT Pub. No.: WO2016/158469
PCT Pub. Date: Oct. 6, 2016

(65) Prior Publication Data
US 2018/0080954 A1    Mar. 22, 2018

(30) Foreign Application Priority Data
Mar. 30, 2015    (JP) .................. 2015-068628

(51) Int. Cl.
*G01P 15/125*    (2006.01)
*G01L 9/12*    (2006.01)
(Continued)

(52) U.S. Cl.
CPC .......... *G01P 15/125* (2013.01); *B81B 3/0021* (2013.01); *G01C 19/5726* (2013.01);
(Continued)

(58) Field of Classification Search
CPC .... G01P 15/125; G01P 15/08; G01P 15/0802; G01P 15/131; G01P 15/18; G01C 19/5726; G01C 19/5747
See application file for complete search history.

(56) References Cited

U.S. PATENT DOCUMENTS 6,461,299 B1 * 10/2002 Hossack ............... B06B 1/0215
600/437
2001/0019273 A1 * 9/2001 Nonoyama ........ G01R 27/2605
324/678
(Continued)

FOREIGN PATENT DOCUMENTS

EP         2060871 A2    5/2009
JP     2006-284272 A   10/2006
(Continued)

OTHER PUBLICATIONS

International Search Report for WO 2016/158469 A1, dated Jun. 14, 2016.
(Continued)

*Primary Examiner* — Helen C Kwok
(74) *Attorney, Agent, or Firm* — Volpe and Koenig, P.C.

(57) ABSTRACT

In a capacitance detection type sensor system, a sensitivity of the sensor system deteriorates because a low frequency noise typified by a 1/f noise cannot be separated in frequency from a signal band. A carrier wave used for capacity detection is modulated with two kinds of frequencies, sampled at a first modulation frequency, subjected to a C/V conversion, and synchronously detected at a second modulation frequency to obtain a signal.

15 Claims, 27 Drawing Sheets

(51) Int. Cl.
G01P 15/08 (2006.01)
B81B 3/00 (2006.01)
G01C 19/5726 (2012.01)
G01D 5/24 (2006.01)

(52) U.S. Cl.
CPC .............. *G01D 5/24* (2013.01); *G01L 9/12* (2013.01); *G01P 15/08* (2013.01); *G01P 15/0802* (2013.01); *B81B 2201/0235* (2013.01)

(56) References Cited

U.S. PATENT DOCUMENTS

| | | | | |
|---|---|---|---|---|
| 2009/0146748 | A1* | 6/2009 | Pernia | H03B 5/04 |
| | | | | 331/109 |
| 2010/0054281 | A1* | 3/2010 | Terazawa | G01C 19/00 |
| | | | | 370/480 |
| 2011/0100126 | A1 | 5/2011 | Jeong et al. | |
| 2012/0285245 | A1 | 11/2012 | Huang et al. | |
| 2013/0133422 | A1* | 5/2013 | Yamanaka | G01C 19/5747 |
| | | | | 73/504.03 |
| 2013/0346015 | A1* | 12/2013 | Yamanaka | G01C 19/5747 |
| | | | | 702/141 |

FOREIGN PATENT DOCUMENTS

| | | |
|---|---|---|
| JP | 2007-327944 A | 12/2007 |
| JP | 2010-169522 A | 8/2010 |
| JP | 2011-095104 A | 5/2011 |
| JP | 2011-107086 A | 6/2011 |
| JP | 2011-169672 A | 9/2011 |

OTHER PUBLICATIONS

Extended European Search Report dated Oct. 29, 2018 for the European Patent Application No. 16772352.7.
Eberhardt et al., "Innovative Concept for the Fabrication of Micromechanical Sensor and Actuator Devices Using Selectively Metallized Polymers," Sensors and Actuators A: Physical. 97-98. 473-477 (2002).

* cited by examiner

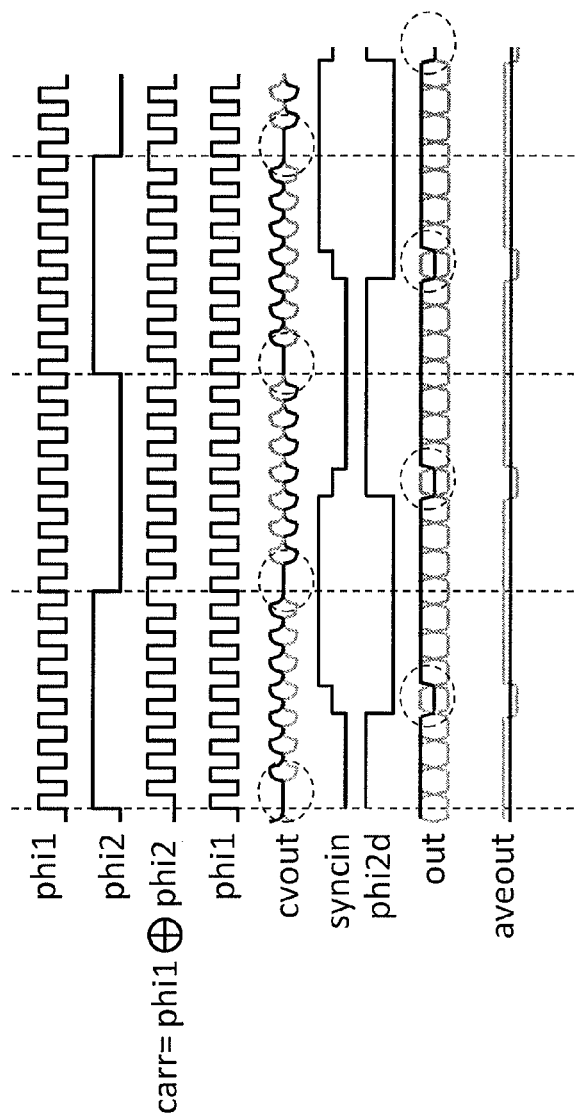

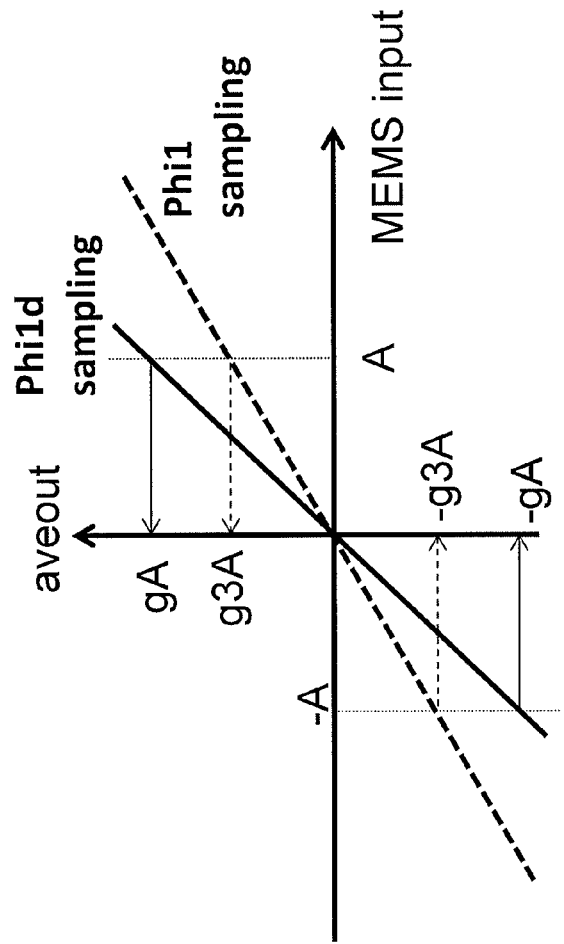

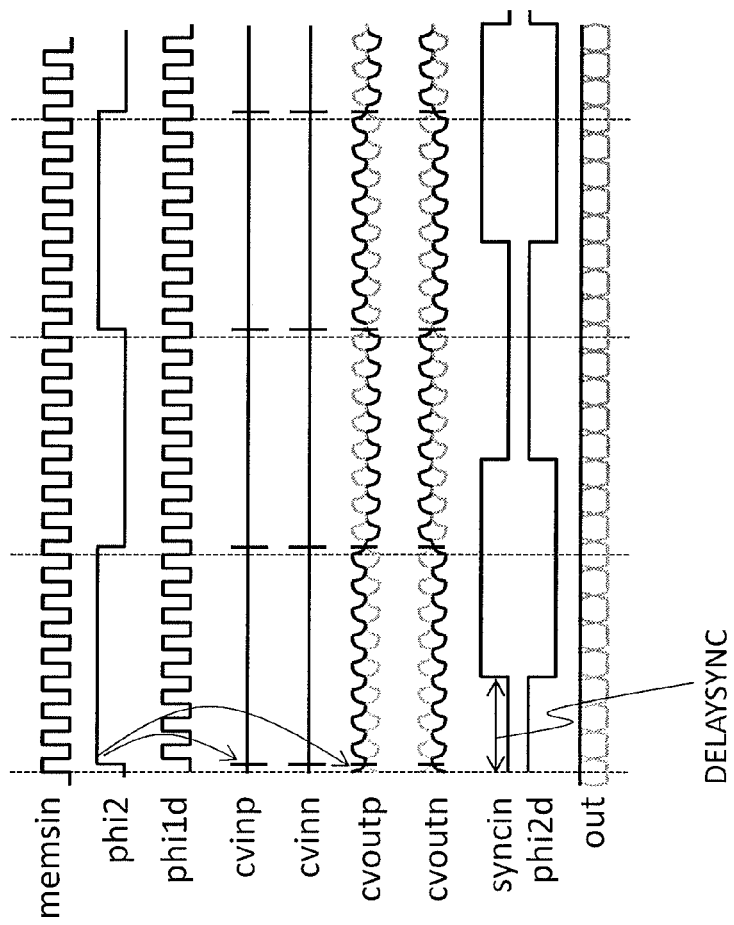

SIGNAL DETECTION METHOD FOR CAPACITANCE DETECTION TYPE SENSOR, MEMS SENSOR, AND SYSTEM

TECHNICAL FIELD

The present invention relates to a capacitance detection type sensor system that reduces a low frequency noise occurring in a detection circuit included in the system and detects a physical quantity that a signal such as an acceleration, an angular velocity, or a pressure appears on a relatively low frequency side with a high sensitivity.

BACKGROUND ART

Sensors that observe inertia of an object such as acceleration or an angular velocity, a pressure variation caused by a substance such as sound waves and seismic waves, and a state of an object such as an inclination angle have been widely used for static and dynamic control of vehicles including automobiles, and acquisition of sound and earthquake information. In recent years, usage of the sensor systems using an MEMS technology have been expanding in combination with a reduction in size and a reduction in price of the sensor systems, such that a vibration sensor is leveraged for the purpose of acquiring maintenance information on aging infrastructure, various control are performed by leveraging information on an inertial sensor introduced to smartphones, and so on.

In the sensor systems as described above, detection principles of sensor elements have been known as a capacitance detection type, a piezo resistance type, and a heat detection type. In the capacitance detection type among those types, physical property values of silicon (Si) and so on are well known, and the MEMS structure applying a semiconductor microfabrication technology with the use of stable materials are employed with advantages that the capacitance detection type can be manufactured inexpensively and compactly with high affinity, and developed actively in universities and companies all over the world. For example, Patent Literature 1 discloses an example of a capacitance detection circuit that detects a change in electrostatic capacitance of a capacitance type sensor element.

The operation of the capacitance detection type sensor will be described with reference to FIG. 1. Now, a typical uniaxial MEMS acceleration sensor will be described as an example, but the capacitance detection type sensor is not limited to MEMS. Moreover, the detection principle of the capacitance detection type pressure sensor and the capacitance detection type angular velocity sensor is the same, and can be considered with the use of the same model.

As illustrated in FIG. 1, the capacitive acceleration sensor includes a frame FRAME, a movable mass MASS, springs kp and kn, dampers dp and dn, a positive side detection electrode ELP, a negative side detection electrode ELN, a positive side detection capacitor Cp, and a negative side detection capacitor Cn. The RRAME and the MASS are electrically connected to each other through the springs, but are electrically insulated from ELP and ELN. Moreover, the FRAME, the ELP, and the ELN are mechanically connected to each other, and those three components move simultaneously with a relative position fixed.

In an initial state, an initial capacity is Cp=Cn=C0. Naturally, Cp and Cn do not perfectly coincide with each other due to a processing accuracy, but in this example, an ideal state will be considered for description of the operation. When acceleration is applied, the FRAME moves in a direction indicated by an arrow in FIG. 1, and a relative position in the FRAME of the MASS changes in the direction of the arrow. Actually, the FRAME does not operate perfectly in one axial direction, but the idea state will be considered. The movement of the MASS is limited by the springs and the dampers and the MASS is not kept to move in one direction.

Since the ELP and the ELN are fixed to the FRAME, the Cp increases and the Cn decreases as a distance between the ELP and the MASS decreases. Conversely, as a distance between the ELP and the MASS increases, the Cp decreases and the Cn increases. As a change in the Cp and the Cn, a capacitance between a terminal memsinp connected to the ELP and a terminal memsout connected to the MASS and a capacitance between a terminal memsinn connected to the ELN and the terminal memsout are measured to detect acceleration. As a method of detecting the electrostatic capacitance, a method of changing an electric charge accumulated in a variable capacitor with the use of carrier waves and reading the electric charge is generally known. Referring to FIG. 1, the carrier waves of opposite phases are input from the respective terminals memsinp and memsinn, and the electric charge coming out from the terminal memsout is measured.

The present technology has been devised to achieve high sensitivity of a capacitance detection type sensor including the MEMS sensor as described above.

CITATION LIST

Patent Literature

Patent Literature 1: Japanese Unexamined Patent Application Publication No. 2011-107086

SUMMARY OF INVENTION

Technical Problem

Referring to FIGS. 2 and 3, problems of higher sensitivity in the capacitance detection type sensor system will be described.

FIG. 2 illustrates a relationship between a physical quantity and noise measured by the capacitance detection type sensor system. In general, a band width of about several tens Hz (Hertz) from a direct current is required for measurement of acceleration and angular velocity. For pressure and microphones, higher tens to hundred kHz are generally required. In the capacitance detection type sensor, it is necessary to detect a change in the electrostatic capacitance by a detection circuit, and the noise generated in the circuit causes a serious problem in the noise performance of the sensor system.

As the noise generated in the circuit, 1/f noise whose noise intensity is proportional to the reciprocal of a frequency and thermal noise whose frequency characteristic is white are well known. The 1/f noise is generated by trapping or releasing the electric charge to a gate insulating film of a MOS transistor. The thermal noise is described by an expression of 4 kBTR for a resistor and am expression of kBT/C for a capacitor. In the expressions, kB is a Boltzmann multiplier, R is a resistance value, and C is a capacitance value.

As is apparent from FIG. 2(a), there is a possibility that the 1/f noise intensity exceeds a sensor output in applications where low frequency characteristics are important, particularly in the acceleration sensors and the angular velocity sensors, and a reduction in the 1/f noise whose intensity is increased more as the frequency becomes lower is indispensable for an increase in the sensitivity of the sensor system. In recent LSIs, the 1/f noise tends to increase as a process rule becomes finer. Also, since the 1/f noise intensity varies depending on a manufacturing process, it is necessary to fundamentally suppress the generation of the 1/f noise.

As illustrated in FIG. 2(b), the detection circuit in the capacitance detection type sensor system mainly includes a C/V conversion circuit C/V that converts a capacitance change of a capacitance detection type element into a voltage change, an AMP that amplifies the C/V output, and an ADC that converts an AMP output which is an analog signal into a digital signal. The detection circuit also includes a filter circuit, but in the present specification, all of those components will not be described in detail. The 1/f noise and thermal noise are generated in the overall circuit.

In order to suppress the 1/f noise, a technique of increasing a gate size of MOS transistors configuring the circuit has been well known. However, when the technique is applied to all of the circuits, a chip size increases and the chip cost increases. Also, an increase in the transistor size generally leads to an increase in power consumption. Furthermore, the above technique has limited effects, and the present inventors have found a tendency that the effect of reducing the 1/f noise decreases as the transistor size increases beyond a certain size. In other words, the present inventors have found that the noise cannot be suppressed to a desired level even if the MOS transistor is enlarged to the limit. Therefore, a method of reducing the 1/f noise without any increase in the MOS transistor area is desired.

FIG. 3 are diagrams created by the present inventors in order to describe the problem of the present invention. Referring to FIGS. 3(a) to 3(e), the operation of the detection circuit in the conventional capacitance detection type sensor system will be described with the use of a description in a frequency space. In the conventional detection method, when a signal is input to a sensor having a bandwidth BW as illustrated in FIG. 3(a), electric charge information is transferred to a circuit with the use of carrier waves Carrier having a frequency of phi1 illustrated in FIG. 3(b). When the electric charge information is sampled at the same frequency phi1 and converted into a voltage in the C/V circuit, a signal spectrum becomes DC (DC) as illustrated in FIG. 3(c). As illustrated in FIG. 2 an AMP and an ADC are present at a rear stage of the C/V circuit, and the 1/f noise generated by those components has the same frequency component as the signal existing on a low frequency side. Therefore, the 1/f noise is superimposed on the signal component as illustrated in FIG. 3(d). As a result, even if a low-pass filter LPF is applied in a subsequent stage as illustrated in FIG. 3(e), the signal and the noise cannot be separated, which hinders the higher sensitivity of the sensor.

Solution to Problem

In order to solve the above problem, in capacitance detection type sensor system according to one aspect of the present invention, a carrier wave modulated with a sampling frequency phi1 of a C/V circuit is further modulated by a second modulation frequency phi2. Also, demodulation is performed with the use of a second modulation frequency phi2 at a subsequent stage of a detection circuit.

According to another aspect of the present invention there is provided a signal detection method of a capacitance detection type sensor for detecting a physical quantity as a change signal of an electric capacitance. In the method, a carrier wave modulated by a first modulation frequency and a second modulation frequency having a frequency lower than the first modulation frequency is generated, the change signal of the electric capacitance is carried by the carrier wave, the change signal of the electric capacitance into a change signal of the voltage is converted with the use of the first modulation frequency as a sampling frequency, and the change signal of the voltage is demodulated with the second modulation frequency, and a frequency filter is applied to the demodulated signal to obtain a desired frequency signal.

As one configuration of a specific use circuit used in the method, for example, the frequency filter is a low-pass filter, and the second modulation frequency is equal to or higher than a transmission frequency band of the low-pass filter.

As another configuration of the specific use circuit, for example, the second modulation frequency is equal to or higher them a frequency obtained by adding a detection frequency bandwidth of the capacitance detection type sensor to a frequency bandwidth having 1/f noise larger than the white noise of the signal detection circuit system that processes the signal of the capacitance detection type sensor, and equal to or lower than half of the first modulation frequency.

An MEMS sensor according to still another aspect of the present invention includes a carrier generation unit that generates a carrier wave modulated with a first modulation frequency and a second modulation frequency, an MEMS element that detects a physical quantity with the use of the carrier wave, and a switched capacitor type CV conversion circuit that samples a detection signal from the MEMS element with a clock having the same frequency as the first modulation frequency. The use of the two frequencies separates the 1/f noise.

As a specific configuration example, the MEMS sensor further includes a filter that removes a frequency component higher than the second modulation frequency. The MEMS sensor further includes a demodulator that demodulates an output from the filter with the use of the second modulation frequency. In addition, as a preferable specific example, the first modulation frequency is shifted in phase from the clock by 180 degrees. In addition, as another preferable specific example, the second modulation frequency is 0.5 times of the first modulation frequency. As still smother preferable specific example, the ADC that quantizes a signal at a subsequent stage of the CV conversion circuit is designed such that a quantization noise intensity becomes a minimum value at the second modulation frequency.

An MEMS sensor system according to still another aspect of the present invention will be described. The system includes a carrier generation circuit that generates a carrier wave modulated with a first frequency signal, an MEMS element that receives the carrier wave as an input and outputs a detected physical quantity as a detection signal, a conversion circuit that samples a detection signal from the MEMS element with a first clock signal having the same frequency as the first frequency signal, an amplifier that is disposed at a subsequent stage of the conversion circuit, an ADC that is disposed at a subsequent stage of the amplifier, a low-pass filter that is disposed at a subsequent stage of the ADC, and a demodulation circuit that is disposed at a subsequent stage of the low-pass filter and performs a demodulation with the use of a second frequency signal different in frequency from the first frequency signal. The carrier wave is further modulated according to a signal having the same frequency as that of the second frequency signal or the detection signal from the MEMS element is modulated according to a signal having the same frequency as that of the second frequency signal and input to the conversion circuit. As a specific configuration of the respective circuits, those circuits may be configured by one chip by a semiconductor technology, may be configured by multiple chips, or may be configured by a circuit using no semiconductor technology. In addition, the system is not limited to being stored in a single housing, but the respective circuits provided separately in terms of location may be connected to each other by various wired or wireless signal transfer technologies.

A more specific configuration example will be described. The carrier generation circuit includes a logic circuit having two inputs and two outputs which receives the first frequency signal and the second frequency signal, and outputs two output signals based on the logic circuit outputs. The MEMS element includes two variable capacitors that receive the respective two output signals from the carrier generation circuit and whose capacitance changes are complementary and includes one output terminal connected to the two variable capacitors. The conversion circuit samples a signal from the output terminal of the MEMS element preferably according to the first clock signal different in phase from the first frequency signal.

Another specific configuration example will be described. The carrier generation circuit includes a logic circuit having two inputs and one output which receives the first frequency signal and the second frequency signal and outputs one output signal based on the logic circuit output. The MEMS element includes two variable capacitors that receive one output signal from the carrier generation circuit and whose capacitance changes are complementary and includes two output terminals that are connected to the respective two variable capacitors. The conversion circuit includes two sampling C/V conversion circuits or one sampling differential C/V conversion circuit that samples the respective outputs from the two output terminals of the MEMS element according to the first clock signal different in phase from the first frequency signal.

Another specific configuration example will be described. The carrier generation circuit outputs one output signal based on the first frequency signal. The MEMS element includes two variable capacitors that receive one output signal from the carrier generation circuit and whose capacitance changes are complementary and includes two output terminals that are connected to the respective two variable capacitors. A modulation circuit is further provided at a subsequent stage of the MEMS element, and the modulation circuit is a modulation circuit that modulates the outputs from the two output terminals with the use of a signal having the same frequency as that of the second frequency signal. The conversion circuit includes two sampling C/V conversion circuits or one sampling type fully differential C/V conversion circuit that samples the respective outputs from the two output terminals of the conversion circuit according to the first clock signal different in phase from the first frequency signal.

Advantageous Effects of Invention

In the capacitance detection type sensor system, since the 1/f noise superimposed on the same band as that of the signal component on the low frequency side is modulated in the circuit, the 1/f noise is separated in frequency from the signal band. As a result, the 1/f noise can be fundamentally removed from the signal band, and a highly sensitive sensor system can be realized without any increase in a chip area and power consumption. The problems, configurations, and effects other than those described above will be clarified from a description of embodiments below.

BRIEF DESCRIPTION OF DRAWINGS

FIG. 14($a$) is an operation waveform diagram when a phase relationship among phi1, phi2 and phi1$d$ is not proper.

FIG. 14($b$) is a graph illustrating the effect when the phase relationship among phi1, phi2, and phi1$d$ is appropriately set.

FIG. 17($b$) is a graph illustrating an example of a band-pass filter BPF.

FIG. 26 is an operation waveform diagram of the fifth and sixth embodiments.

DESCRIPTION OF EMBODIMENTS

Figure 1:
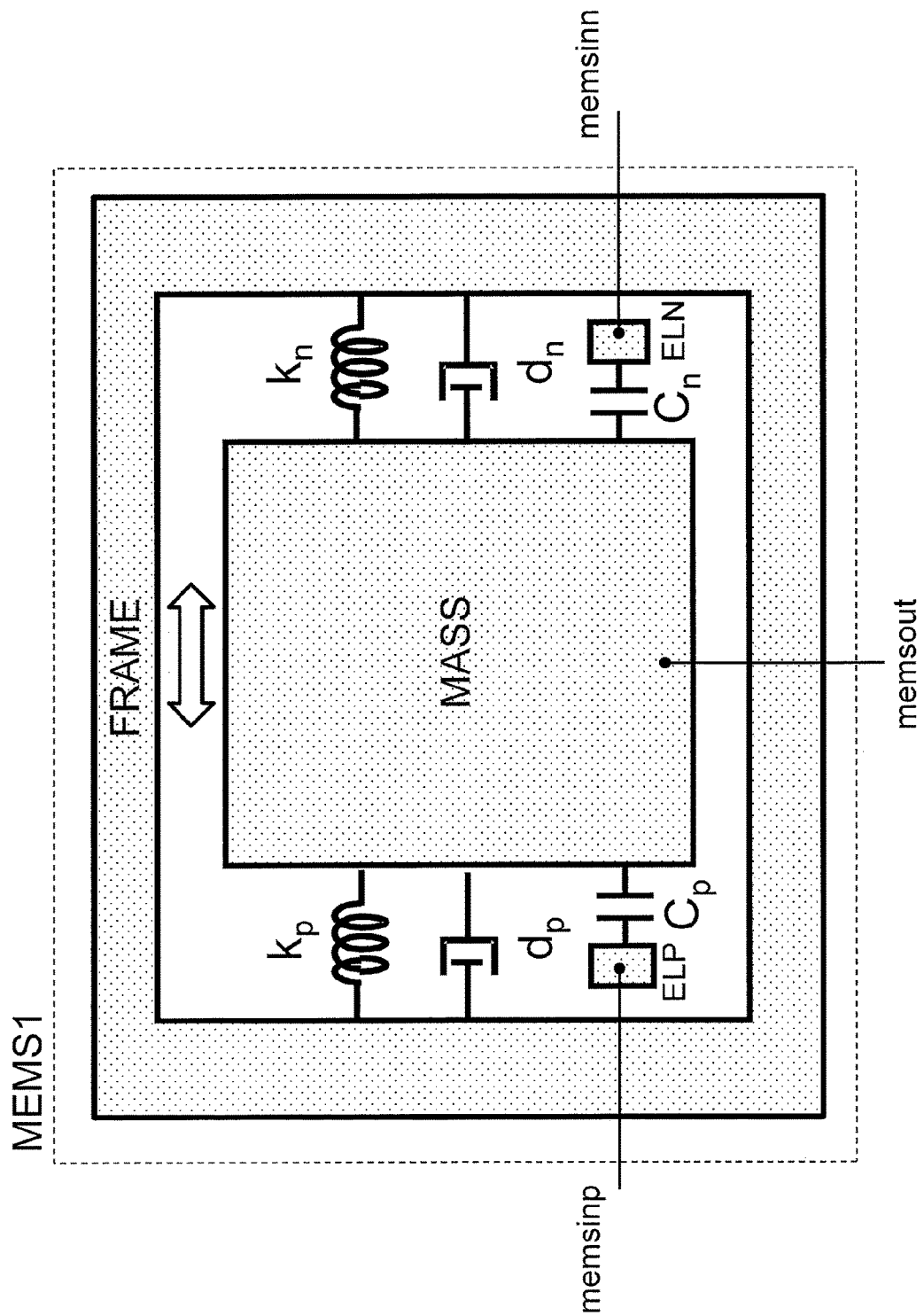
FIG. 1 is a top view illustrating a configuration example of a general uniaxial acceleration sensor.

Embodiments of the present invention will be described hereinafter with reference to the accompanying drawings. In all the drawings for use describing the embodiments, identical members are in principle denoted by like reference numerals, thereby omitting detailed description thereof. The present invention should not be construed as being limited to the description of the embodiments described below. Those skilled in the art can easily understand that specific configurations can be changed without departing from the spirit or gist of the present invention.

The notations such as "first", "second", "third" and the like in the present specification and the like are attached to identify components, and do not necessarily limit the number or order. In addition, the number for identifying the constituent element is used for each context, and the number used in one context does not necessarily indicate the same constitution in other contexts. Also, the component identified by a certain number is not prevented from doubling as the function of the component identified by another number.

The positions, sizes, shapes, ranges, and the like of the respective components shown in drawings and the like may not show actual positions, sizes, shapes, ranges and the like in order to facilitate understanding of the invention. Therefore, the present invention is not necessarily limited to the position, size, shape, range, etc. disclosed in the drawings and the like.

Components expressed in the singular herein as singular shall include the plural unless the components are explicitly indicated in a special context.

First Embodiment

Figure 2:
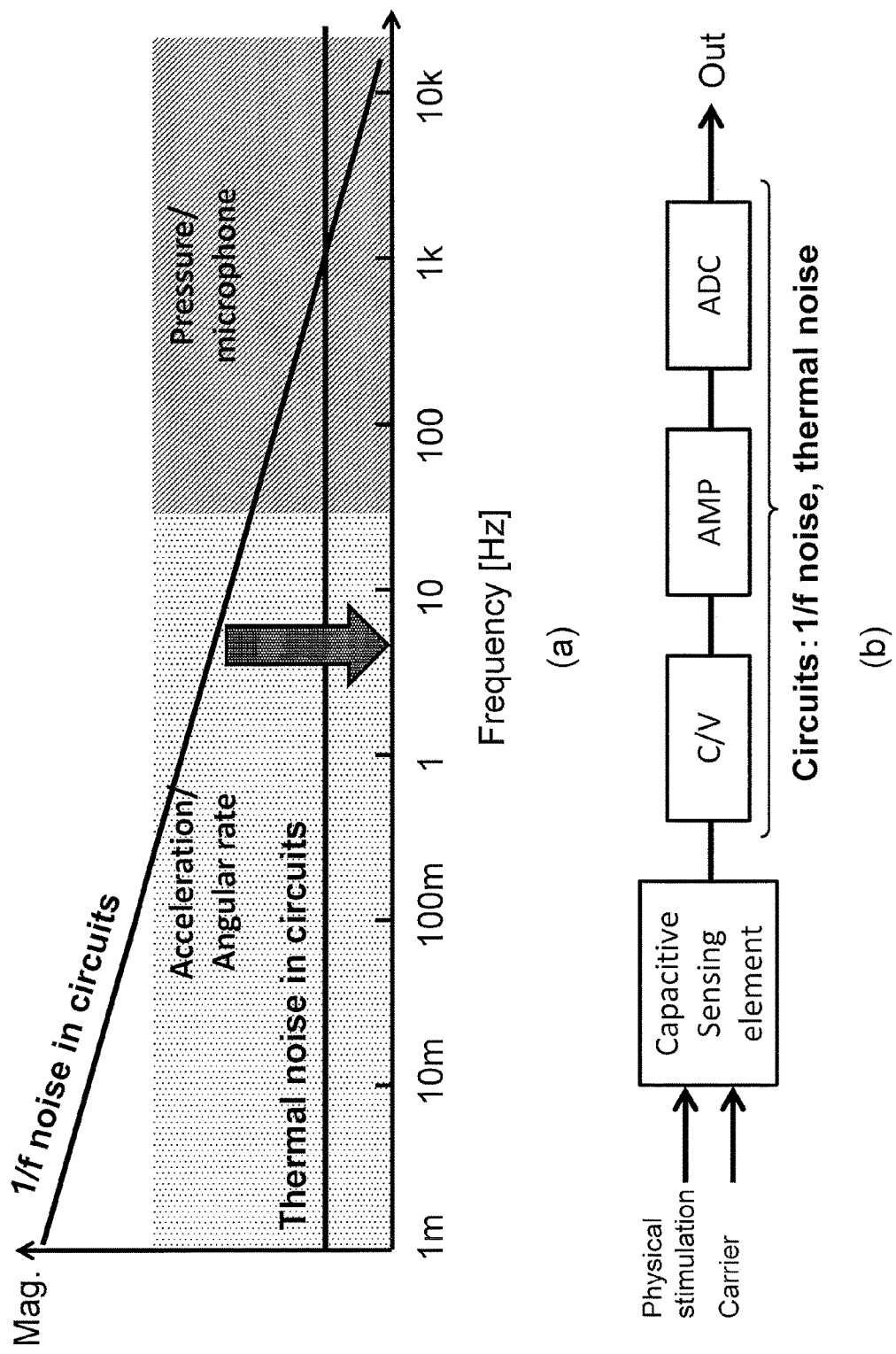
FIG. 2($a$) is a graph illustrating a relationship between physical quantities such as an acceleration, an angular velocity or a pressure, and a noise occurring in a circuit, and FIG. 2($b$) is a block diagram of a capacitance detection type sensor system.
Figure 3:
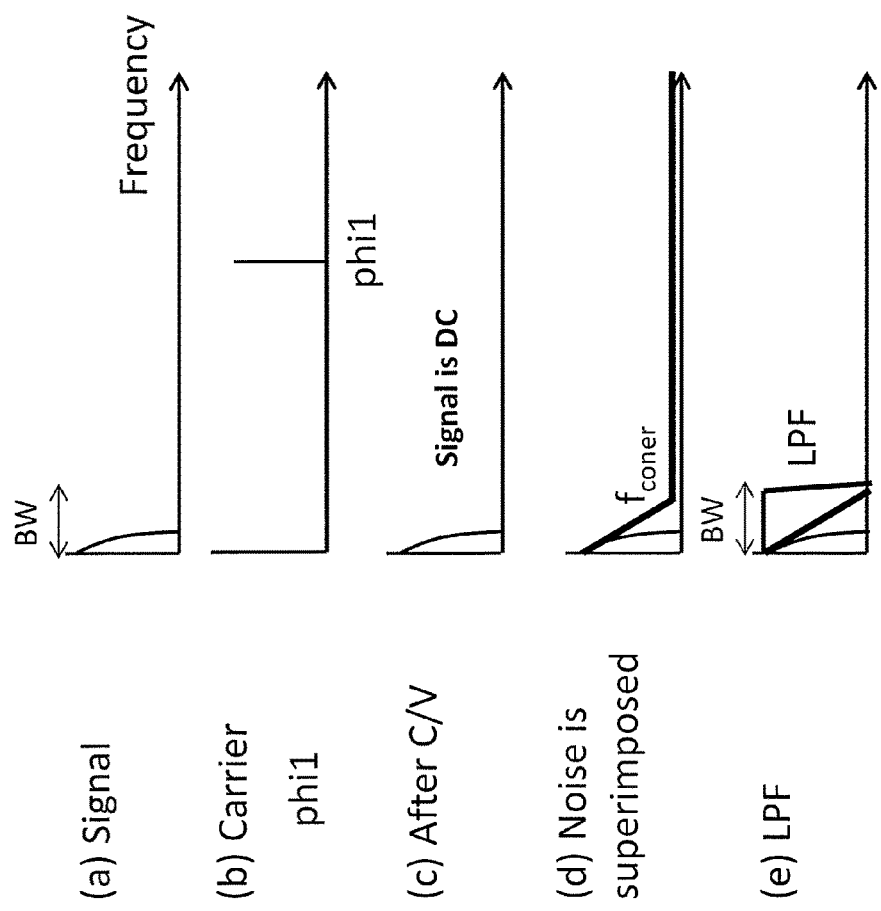
FIGS. 3($a$) to 3($e$) are waveform diagrams illustrating a signal processing flow for illustrating a problem with the present invention.
Figure 4:
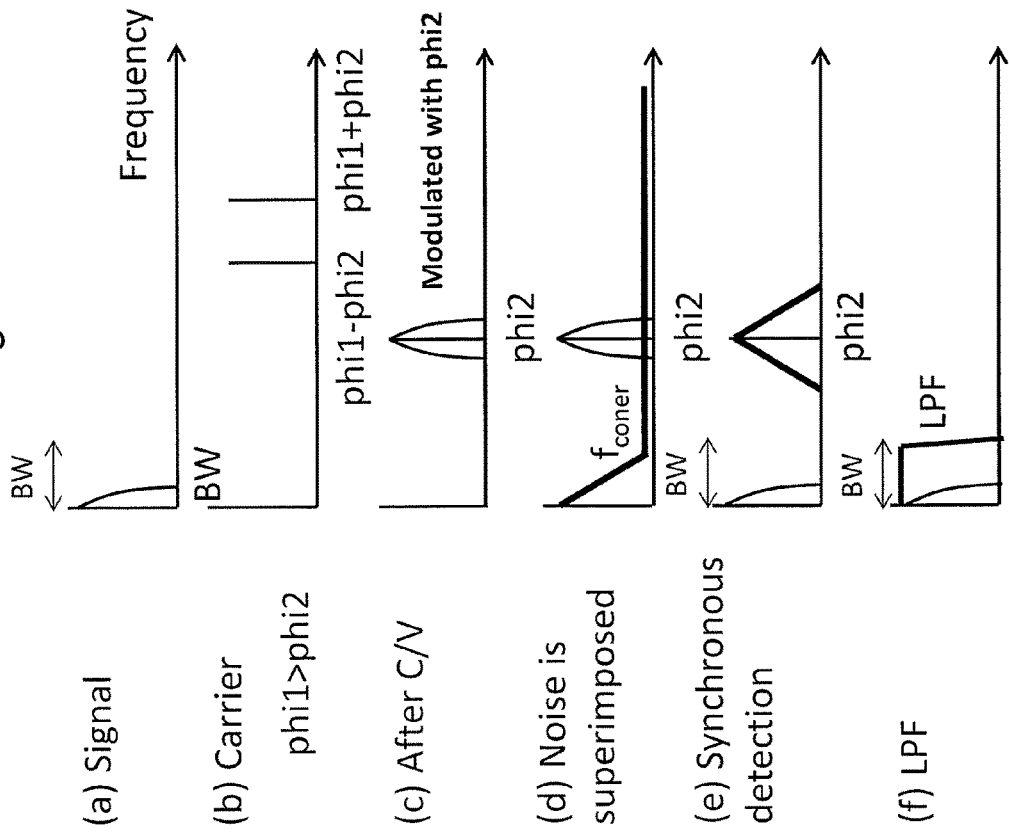
FIGS. 4($a$) to 4($f$) are waveform diagrams illustrating a signal processing flow using a modulated carrier wave.

A fundamental idea of the present invention will be described with reference to FIG. 4. FIG. 4(a) illustrates a state in which a physical signal within a bandwidth BW is input similarly to FIGS. 3(a) to 3(e). FIG. 4(b) illustrates a spectrum of a carrier wave, which is modulated with a sampling frequency phi1 of the C/V conversion circuit and the second modulation frequency phi2 smaller than phi1. For simplification, a line spectrum is illustrated, but when a rectangular wave is used, a component of an odd harmonic wave appears. In this example, for the sake of simplification, a description will be given with the line spectrum. Since cos (phi1)×cos (phi2)=½ {cos (phi1+phi2)+cos (phi1−phi2)} is derived from a trigonometric function formula, two spectra of phi1±phi2 appear. FIG. 4(c) illustrates a spectrum of an output from the C/V conversion circuit, and since the signal is sampled by phi1, the phi1 component becomes DC, but the component of the second modulation frequency phi2 remains, and the signal is still kept modulated by phi2. Although a 1/f noise is superimposed on a low frequency side at a subsequent stage of the C/V conversion circuit, since the signal is modulated to a frequency band in which the 1/f noise is sufficiently small, noises and signals are not mixed with each other. As illustrated in FIG. 4(e), the signal is demodulated with phi2 so that the signal returns to an original band, and conversely the noise generated in the circuit is modulated to phi2. Thereafter, as illustrated in FIG. 4(f), noise components can be eliminated by passing through BW and applying a low-pass filter LPF which cuts the higher frequency than the BW. In comparison with the conventional system illustrated in FIG. 2, although a modulation circuit of the carrier wave and a demodulation circuit of the signal are increased in the present invention, since the 1/f noise can theoretically be completely eliminated, as compared with a method of expanding the area of the MOS transistor, a large noise reduction effect can be exerted although an increase in the chip area and an increase in the power consumption are small.

Figure 5:
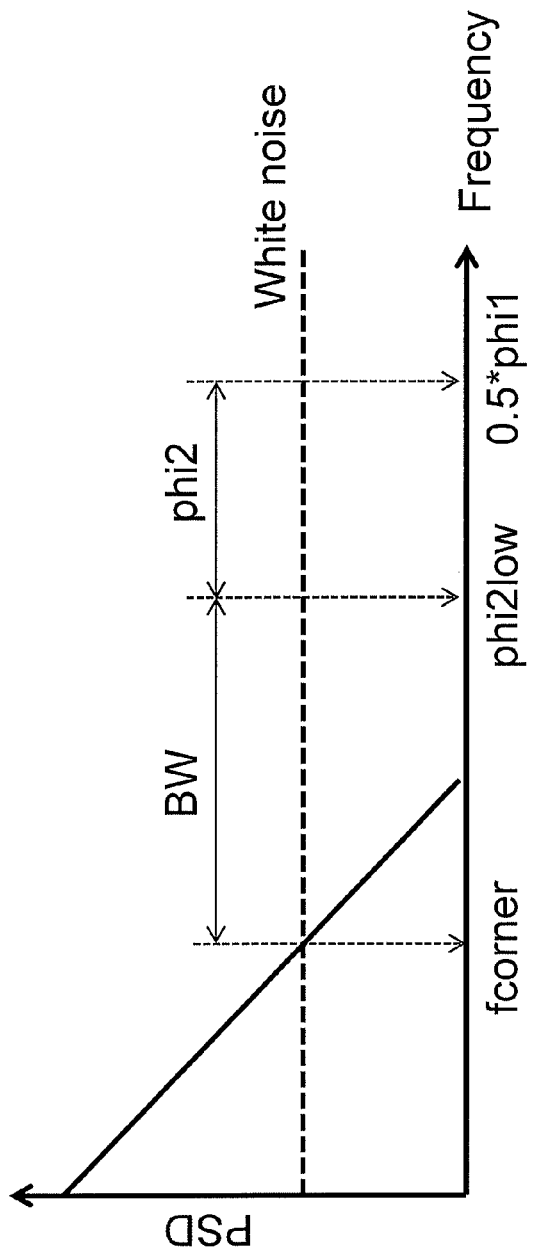
FIG. 5 is a graph illustrating a method of determining a second modulation frequency phi2.

FIG. 5 illustrates a method of determining the second modulation frequency phi2. Since the 1/f noise decreases in inverse proportion to a frequency, a magnitude relationship between a white noise and a spectral intensity PSD (power spectral density) is reversed at a certain frequency. This frequency is defined as fcorner. When a frequency which is larger than the fcorner by the sensor bandwidth BW is defined as phi2low, a lowest frequency of phi2 is phi1low. This is because since the signal modulated by phi2 has spectrum in the band of phi2±BW, the 1/f noise returns to BW during demodulation with phi2 unless phi2−BW≥fcorner is satisfied.

On the other hand, an upper limit of phi2 is half the frequency of phi1. At this time, a sign of the C/V output is inverted every sample. Since phi2<phi1 is a premise, a state in which phi2 is larger than phi1 is not considered. It is desirable that phi2 is sufficiently away from the high frequency side from the viewpoint of a natural vibration frequency of the sensor. When phi2 is set to a value close to the natural vibration frequency, the vibrating body is excited by the carrier wave, and the function as a sensor is remarkably impaired.

Figure 6:
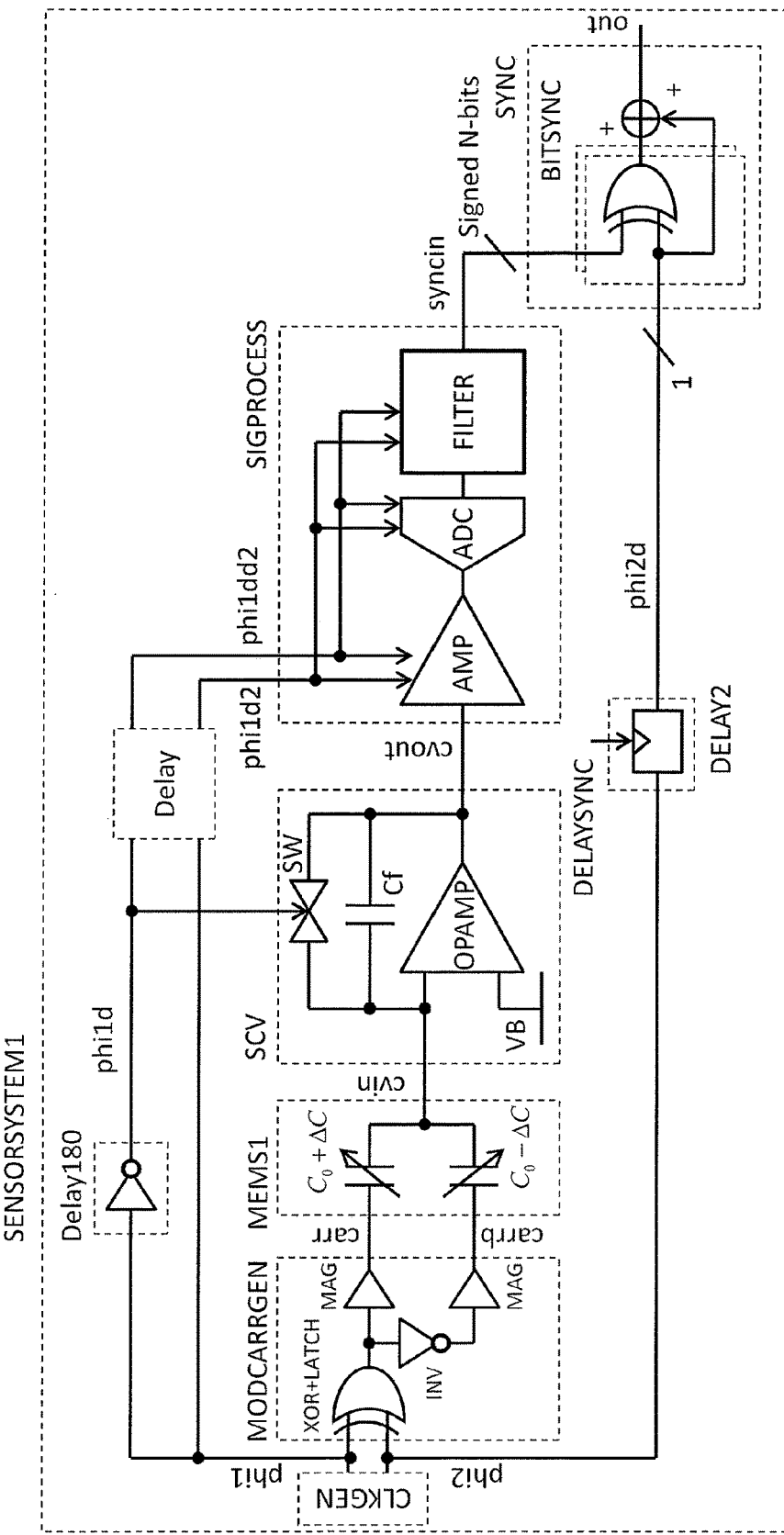
FIG. 6 is a circuit diagram of a capacitance detection type sensor system using a modulated carrier wave according to a first embodiment.

FIG. 6 illustrates a processing system SENSORSYSTEM1 of a specific system. A first carrier frequency phi1 and a second modulation frequency phi2 are generated in CLKGEN. A carrier wave is input to a capacitance detection type sensor 1 MEMS1 through a modulated carrier generation circuit MODCARRGEN which outputs a carrier carr modulated with those frequencies as inputs and carrb having an opposite sign of carr. MODCARRGEN typically includes one XOR gate, MAG that amplifies a signal generated by XOR to a carrier amplitude, and a NOT gate for generating carrb. Since the output of XOR may cause spike noise when modulating phi2, it is desirable to provide an appropriate latch at a subsequent stage of XOR to prevent the spike noise from being generated.

Although MEMS1 typically has a structure illustrated in FIG. 1, MEMS1 is not limited to this structure exactly. If MEMS1 is described by an equivalent circuit, MEMS1 is configured by a sensor element having two input terminals and one output terminal, having two variable capacitors inside, whose capacitance changes are complementary as illustrated in FIG. 6. The output of the MEMS1 is input to the sampling C/V conversion circuit SCV. SCV is a general switched capacitor type C/V conversion circuit, and phi1*d* which is an output of a delay element Delay180 delaying phi1 by 180 degrees is used as the sample clock. In this example, 180 degrees are not a strict meaning, but there is no problem if the phase of phi1*d* is delayed by about 180 degrees from phi1 in terms of circuit operation. Therefore, Delay180 is configured by one NOT gate as an example. Alternatively, a mechanism that is provided with a variable delay element and finely adjusts a delay amount by register setting may be provided. SCV includes one operational amplifier OPAMP, one capacitor Cf, and an analog switch SW. Cf sets an appropriate value depending on a driving force of OPAMP, a capacitance C0 of MEMS1 and the like. A reference voltage VB determines a reset level at an output cvout of SCV. When a gain of OPAMP is sufficiently large, a voltage level of cvin which is an input, of SCV is fixed to VB. As illustrated in FIG. 4, cvout is a state modulated by phi2.

The cvout is input to a circuit block SIGPROCESS which performs signal amplification, conversion to a digital signal, and filter processing. As an operation clock, phi1$dd$2 and phi1$d$2 obtained by appropriately delaying phi1 and phi1$d$ by the delay circuit Delay are used, but the operating frequency is equivalent to that of phi1. Because of its nature, ADC sometimes uses high-speed clocks of many times of phi1 internally, but in that case, ADC is also included in the scope of the present patent. Various methods are conceivable for AMP, but in this example, AMP represents the entire circuit that amplifies the signal, and is not limited to a specific amplifier circuit. The same is applied to ADC, and various methods such as a flash type, a $\Delta\Sigma$ type, a cyclic type and a successive approximation type have been known, but all of those types are included. There are various concrete circuits for the filter circuit FILTER, but in this example, the filter circuit FILTER is a filter for adjusting a phase and a gain in a general frequency domain.

An output of SIGPROCESS is input to a synchronous detection circuit SYNC as syncin. The clock used for synchronous detection uses phi2$d$ obtained by delaying phi2 by a delay circuit DELAY2. The syncin is described assuming a signed n-bit signal in an example of FIG. 6. In this case, SYNC includes n number of 1-bit demodulators BITSYNC including one XOR and one adder that adds phi2$d$ to n-bit BITSYNC output. For each BITSYNC, it is conceivable to operate one XOR by n time division in order to reduce a circuit scale. In this case, since the circuit scale can be reduced, it is possible to reduce the chip area and to reduce the cost. It is assumed that SYNC includes the overall circuit having a function of demodulating the signal syncin with the use of phi2$d$.

DELAY2 is a functional block that delays a synchronous detection clock phi2 according to a signal delay generated in SCV and SIGPROCESS, and generates phi2$d$. In a typical example, DELAY2 is a clocked buffer driven by DELAYSYNC, Delay amount is given by DELAYSYNC. Basically, the delay amount may be set to a fixed value and does not depend on the characteristics of the MEMS1. However, it is also conceivable to control the value of DELAYCYNC based on the information of the temperature sensor, and this configuration is also included in the present patent. In this case, a sensor output that is stable against a temperature change can be obtained, which contributes to high reliability of the sensor system.

Figure 7:
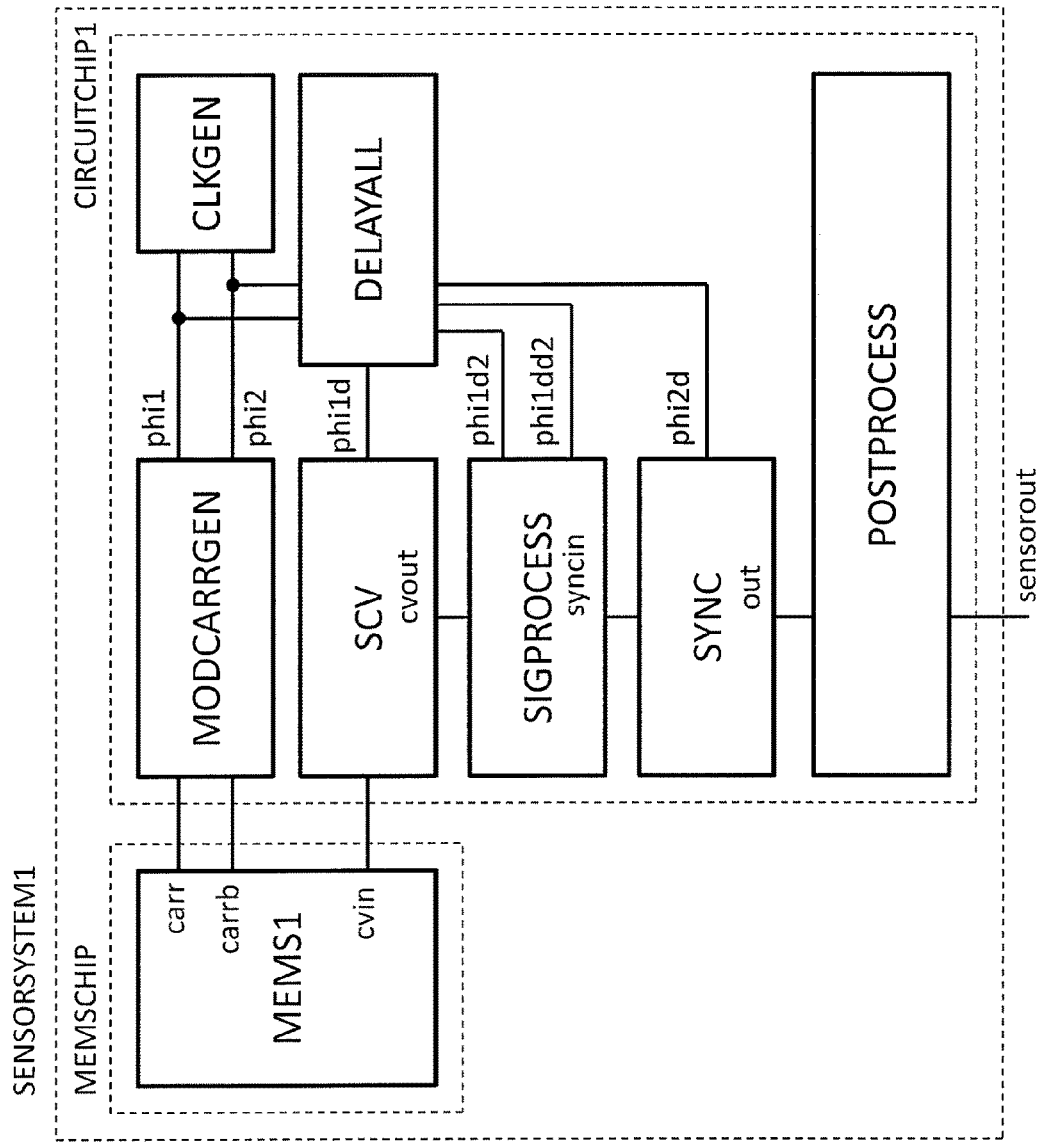
FIG. 7 is a block diagram of an example realizing a two-chip configuration according to the first embodiment.

FIG. 7 illustrates an example in which the sensor system SENSORSYSTEM1 according to the first embodiment is configured by two chips including a MEMS chip MEMSCHIP and a signal processing circuit chip CIRCUITCHIP1. A circuit block name and a wiring node name are the same as those in FIG. 6. CIRCUITCHIP1 is configured in such a manner that all of a circuit block MODCARRGEN that generates a modulated carrier wave, a clock generation circuit CLKGEN that generates phi1 and phi2, a sampling C/V conversion circuit SCV, and DELAYALL including all of circuit blocks for delaying the clock illustrated in FIG. 6, a circuit block SIGPROCESS for amplifying, digitizing and filtering an analog output of the C/V conversion circuit, a circuit block SYNC that performs synchronous detection, and a circuit block POSTPROCESS that processes an output after synchronous detection are included in the same chip. As a result, advantageously, it is easy to introduce contrivance on the chip which reduces the noise level, for example, by using shielded lines for signal lines through which analog signals propagate. Also, with a reduction in the number of chips, the mounting cost is reduced and the cost of the entire sensor system is reduced.

sensorout which is an output of SENSORSYSTEM1 is leveraged to control a higher system. Specifically, sensorout is used for a posture control of various vehicles such as automobiles and helicopters, and a posture control of various robots that operate unmanned by radio control. The sensorout is also expected to be used for high sensitivity detection of seismic waves, sound waves, and so on. There are myriad of systems to be applied, but a description of each system with reference to drawings will be omitted.

Figure 8:
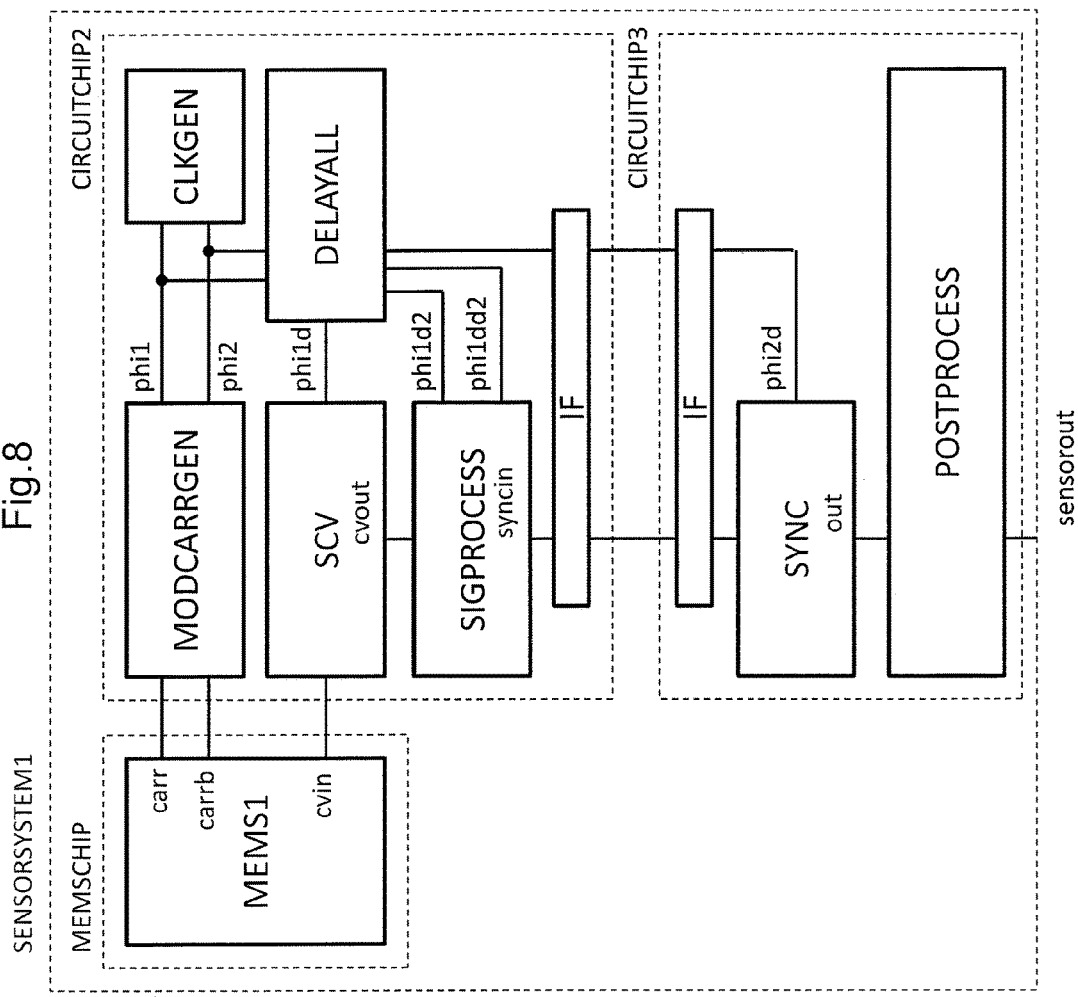
FIG. 8 is a block diagram of an example realizing a three-chip configuration according to the first embodiment.

FIG. 8 illustrates a second chip configuration of SENSORSYSTEM1. The circuit blocks and the node names configuring the system are the same as those in FIGS. 6 and 7. A difference resides in that only MODCARRGEN, CLKGEN, SCV, DELAYALL, and SIGPROCESS are mounted on CIRCUITCHIP2, and SYNC and POSTPROCESS are mounted on a second circuit chip CIRCUITCHIP3. Communication between both of those circuit chips is realized by wire, and an interface circuit block IF is included in both of those chips. Although sensor data is transferred from CIRCUITCHIP 2 to CIRCUITCHIP 3, because it is also conceivable to control various setting items in CIRCUITCHIP2 from CIRCUITCHIP3, it is preferable that each IF includes a driver enabling transmission and reception. Since the output of SIGPROCESS is digital, even if SIGPROCESS is mounted on a separate chip, the sensitivity of the sensor system is hardly deteriorated.

In a three-chip configuration of FIG. 8, CIRCUITCHIP2 functions as an analog front end and CIRCUITCHIP3 functions as a digital signal processing chip. This makes it possible to configure, for example, CIRCUITCHIP3 with a general-purpose chip such as an FPGA, which has advantages such as a reduction in a development period and a change in the circuit configuration even after manufacture. Furthermore, since one CIRCUITCHIP3 can be shared by a plurality of MEMSCHIP and CIRCUITCHIP2, a multiple sensor system can be realized with low cost (a small number of chips). On the other hand, if one sensor system is realized with this configuration, since the number of chips increases, it is conceivable that the mounting cost may increase. Therefore, at an initial stage of development of the sensor system, the configuration illustrated in FIG. 8 is preferable, and it is desirable to employ a two-chip configuration as illustrated in FIG. 7 as a cost cut version after specification determination.

Figure 9:
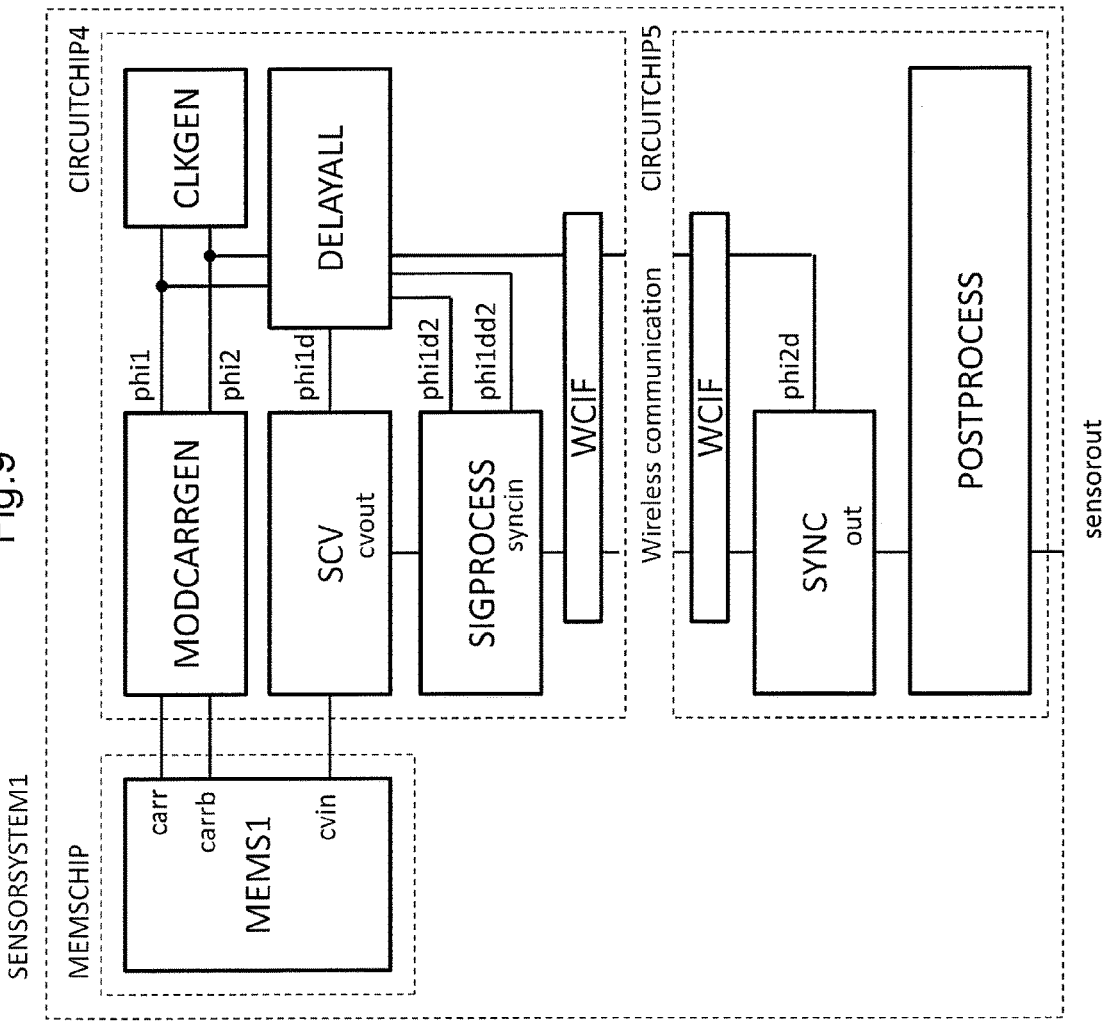
FIG. 9 is a block diagram of an example in which the first embodiment is realized with a three-chip configuration and radio communication is performed between signal processing chips.

FIG. 9 illustrates a third chip configuration. As compared with the configuration of FIG. 8, a circuit chip CIRCUITCHIP4 has a configuration in which IF in CIRCUITCHIP3 in FIG. 8 is replaced with a wireless communication interface circuit WCIF. Similarly, a circuit chip CIRCUITCHIP5 has a configuration in which IF in CIRCUITCHIP4 in FIG. 3 is replaced with a wireless communication interface circuit WCIF. As a result, CIRCUITCHP4 and CIRCUITCHIP5 can transmit and receive data by wireless communication. Since the output of CIR- CUITCHIP4 is a digital signal, the sensitivity deterioration of the sensor system due to communication can be suppressed to a small level, while CIRCUITCHIP5 can be installed in a physically remote place. In addition, a configuration in which the circuit configuration included in one CIRCUITCHIP5 is shared by a plurality of CIRCUITCHIPs 4 is enabled at a low cost in wireless communication, and there is an advantage that a scale of the sensor system can be freely expanded.

The operation of the circuit of FIG. 6 will be described with reference to FIG. 10. The figure illustrates how the detection circuit operates when a positive constant physical quantity is input to the sensor. In this example, phi2 is set to a frequency which is 1/16 times of phi1. As illustrated in FIG. 5, phi2 is larger than fcorner+band width BW and smaller than half of phi1, and furthermore, a frequency away from the resonance frequency of MEMS1 can be arbitrarily selected. In addition, although phi1 and phi2 are rectangular waves for simplification, sinusoidal waves may be used as long as the circuit scale can be increased. In this case, because harmonics of odd number times are not generated at the time of modulation and demodulation as compared with the case of rectangular wave, signal processing with less noise can be performed.

carr is an exclusive OR of vibrating states of phi1 and phi2 and an amplitude of carr has a value amplified by MAG of FIG. 6. Phi1$d$ has a phase obtained by delaying phi1 by 180 degrees. In the sampling C/V circuit, a state of sampling when phi1$d$ is "H" and a state of resetting when phi1$d$ is "L" appear as a waveform of cvout. The sampling output of cvout becomes a signal whose positive or negative level is inverted according to a cycle of phi2. This is because a polarity of carr is inverted with a cycle of phi2. Specifically, a value of cvout=VB±2 MAG×ΔC/Cf is obtained with the use of the notation of FIG. 6. Cvout is delayed by DELAY-SYNC through AMP, ADC, FILTER, and so on in a subsequent stage of the C/V conversion circuit and becomes an input signal syncin to the synchronous detection circuit. Therefore, phi2$d$ obtained by delaying phi2 by DELAY-SYNC is generated, and synchronous detection is performed by the generated phi2$d$. In the synchronous detection, as illustrated in FIG. 6, basically, in order to calculate an exclusive OR of syncin and phi2$d$, out outputs a positive signal reflecting a positive physical quantity input to the sensor.

Figure 10:
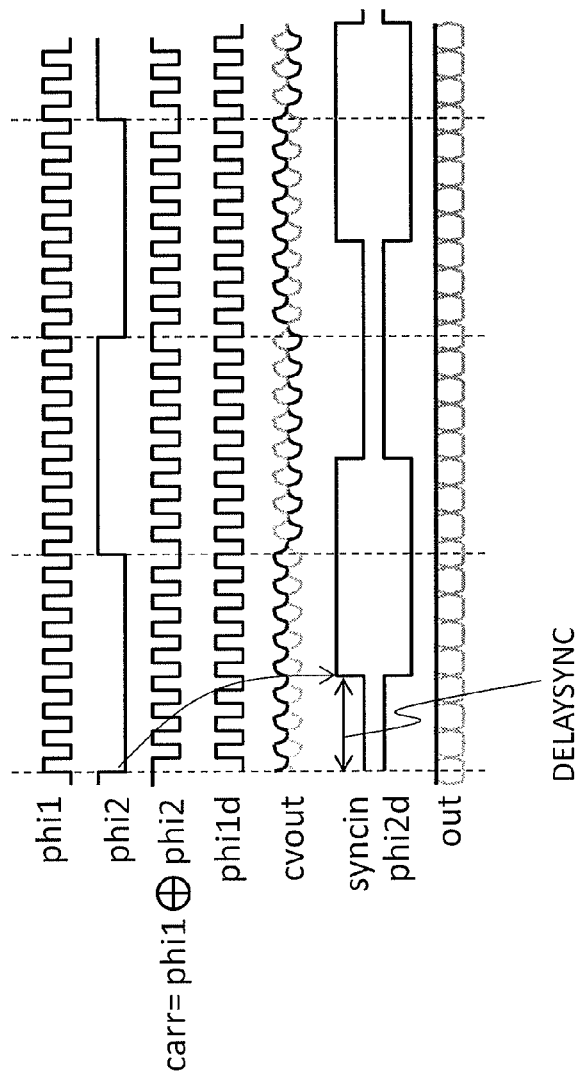
FIG. 10 is an operation waveform diagram of the first embodiment.

In FIG. 10, an ideal state in which cvout is output as a target level in positive and negative with VB as the center is described. However, an amplification factor may be different from each other between a level of VB or more and a level of VB or less due to an imperfection of an operational amplifier configuring the C/V conversion circuit.

Figure 11:
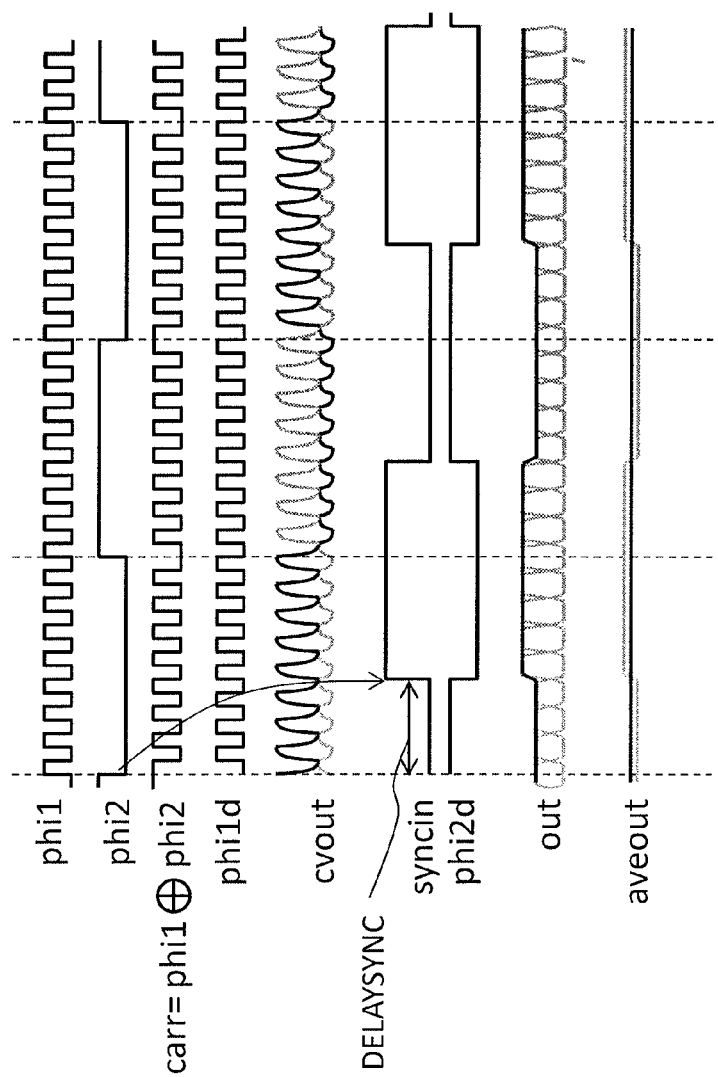
FIG. 11 is an operation waveform diagram in the case where an MEMS1 has a sensitivity asymmetry.

FIG. 11 illustrates waveforms in the case of an incomplete C/V conversion circuit. The out is averaged within a range where there is no influence on the signal band BW, thereby being capable of obtaining a constant positive output as with aveout, and hiding the asymmetry of the C/V conversion circuit.

Figure 12:
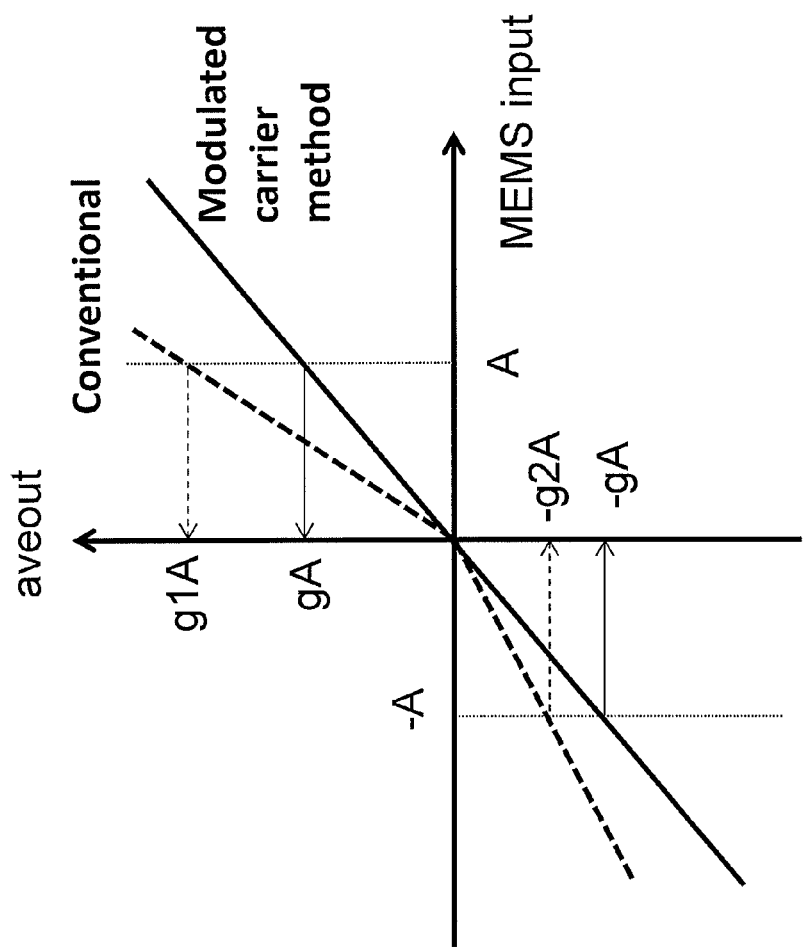
FIG. 12 is a graph illustrating the effect of application of the first embodiment to the MEMS1 having the sensitivity asymmetry.

FIG. 12 illustrates the advantages of hiding the asymmetry of the C/V conversion circuit. When there is the asymmetry in the conventional method, the sensor system output becomes asymmetrical with g1A and −g2($a$) in the case where the magnitude of the input physical quantity to the sensor element MEMS is A and in case where the magnitude is −A. In this example, g1 is a positive side gain and g2 is a negative side gain. This indicates that the linearity of the sensor system is deteriorated. On the other hand, when the present invention system is applied, the asymmetry of the C/V conversion circuit is eliminated by averaging as illustrated in FIG. 11, so that an output of ±gA of a target can be obtained for positive and negative same size inputs. In this example, g is a common gain in positive and negative. The asymmetry of the output seen in the conventional method is eliminated and a sensor system having an excellent linearity can be configured.

Figure 13:
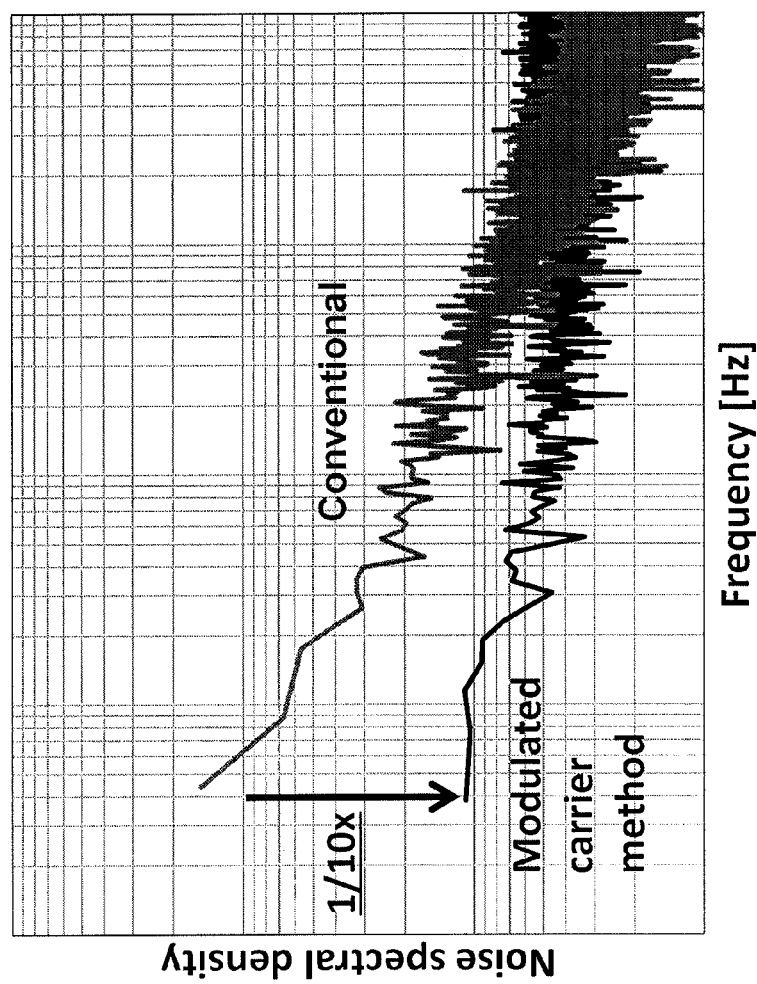
FIG. 13 is a graph illustrating the effect of improving a noise level in the case of using a modulated carrier wave.

FIG. 13 is an experimental result comparing the circuit to which the conventional method is applied and the circuit to which the present invention method is applied. Both of those circuit chips are fabricated with the use of the same process node in the same semiconductor process step. It is actually confirmed that the noise spectrum density on the low frequency side can be reduced to 1/10.

The reason for using phi1$d$ with phi1 delayed by 180 degrees for the sampling of the C/V conversion circuit will be described in FIG. 14.

FIG. 14($a$) illustrates a waveform when the sampling of the C/V conversion circuit is performed by phi1. Since a transition timing of phi2 is the same as a transition timing of phi1, a level of carr does not change at the rising of phi1 which is the sampling timing of the C/V conversion circuit. As a result, no signal is output to cvout at the transition timing of phi2. This state is highlighted by dotted circles in the figure. As a result, output zero appears at a cycle of phi2×2. In an example of FIG. 14($a$), the output cannot be obtained at a rate of once every eight times, but if the frequency is phi2=phi1÷2, no signal can be obtained at all. The aveout obtained by averaging out can hide a periodic zero output, but as a result, a level of aveout decreases as compared with the case of using phi1$d$ as illustrated in FIG. 14($b$). Hence, phi1 is used for sampling of C/V conversion and the output is ±g3($a$), g3($a$)<gA is met, which is not suitable for configuring a highly sensitive sensor system. Therefore, in order to increase the sensitivity of the sensor system, setting the phase relationship among phi1, phi2 and phi1$d$ as illustrated in FIG. 10 is optimum for applying the present invention method.

Figure 15:
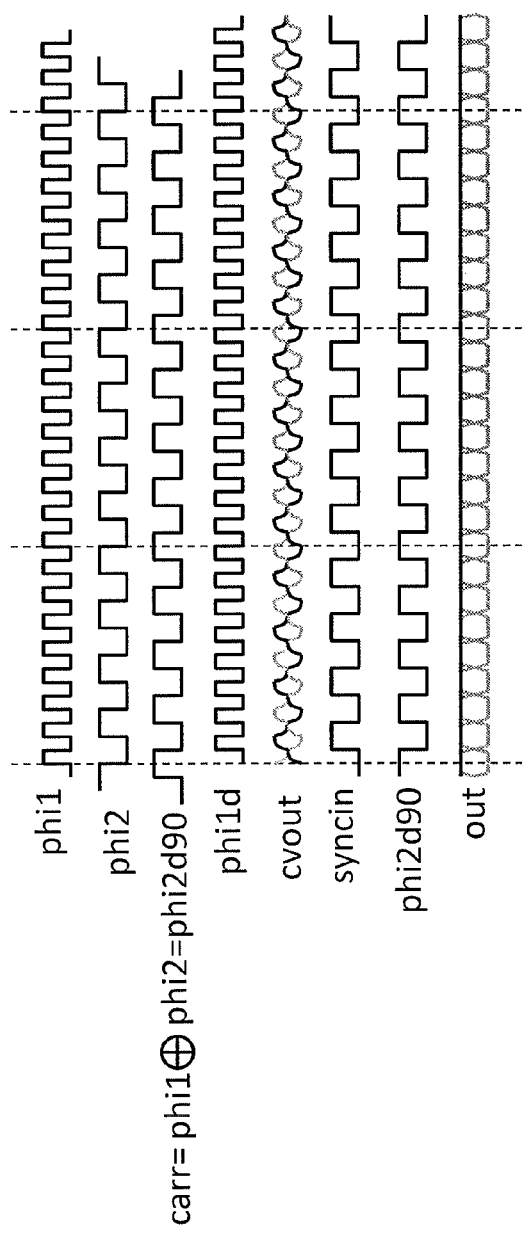
FIG. 15 is an operation waveform diagram in the case where a frequency of phi2 is set to 0.5 times of a frequency of phi1.

Referring to FIG. 15, the advantage of setting the frequency of phi2 to 0.5 times of phi1 will be described. In this case, the output of the exclusive OR between phi1 and phi2 is phi2$d$90 obtained by delaying phi2 by 90 degrees. Therefore, instead of generating the exclusive R of phi1 and phi2 by XOR in the circuit, the 90 degree delay circuit is applied to the phi2, to thereby obtain phi2$d$90 applied to carr. As a result, a circuit necessary for generation of carr can be simplified. In the demodulation, it is necessary to consider an appropriate delay SYNC DELAY in FIG. 10. However, in a scheme of FIG. 15, since positive and negative are surely inverted with the frequency of phi2, the inversion operation is mechanically performed without taking the delay into consideration, thereby being capable of performing the demodulation. As a result, there is an advantage that the demodulation circuit including the delay adjustment can be simplified.

Figure 16:
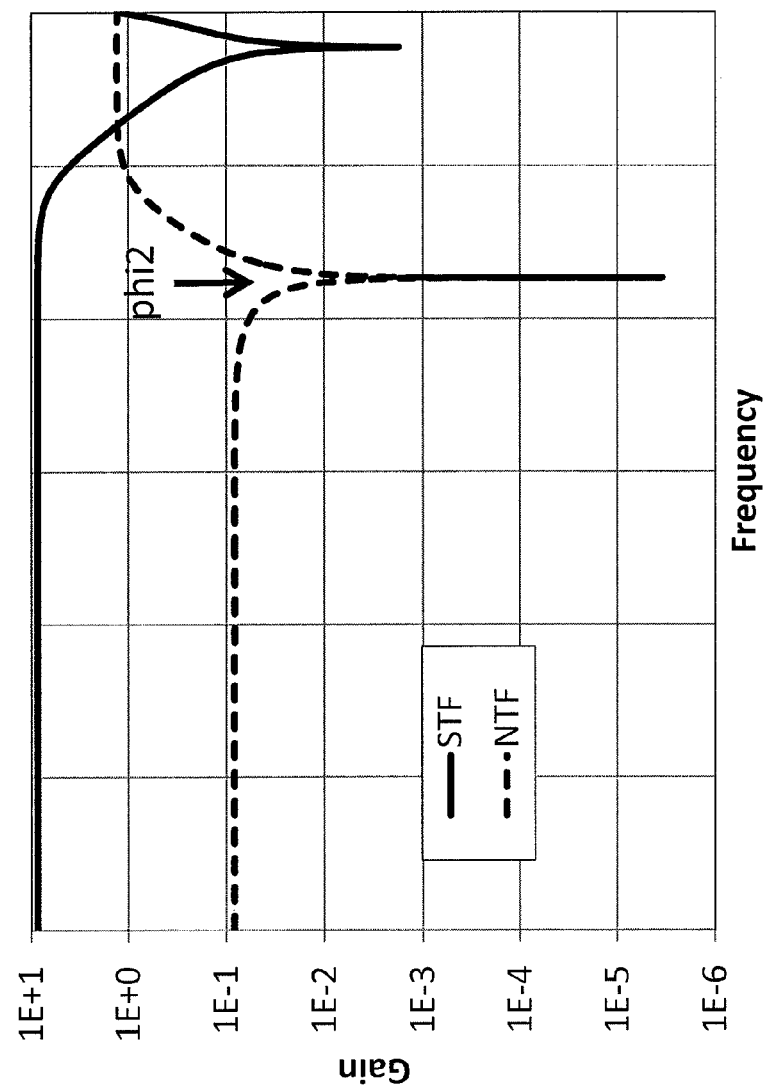
FIG. 16 is a graph illustrating an example of frequency characteristics of an ADC having a minimum value of a noise transfer function in phi2.

FIG. 16 illustrates an example of a signal transfer function STF and a quantization noise transfer function NTF of the ADC to be applied. There are various types of ADC, and STF and NTF can be designed relatively freely. In designing the ADC, since the input signal is modulated with phi2 in the ADC applied to the present invention method, it is desirable to design the NTF so that the NTF takes a minimum value at phi2. As a result, the quantization noise mixed into the signal at the time of demodulation can be minimized, and the sensitivity of the sensor system can be increased. Also, it is desirable that the frequency width of a notch portion of the NTF be as large as the bandwidth BW of the sensor system.

With such a setting, the mixing of the quantization noise can be minimized over the entire BW range and the quantization noise intensity within the BW can be set to a constant value, to thereby contribute to a reduction in the frequency dependence of the sensitivity of the sensor system within the BW.

Figure 17:
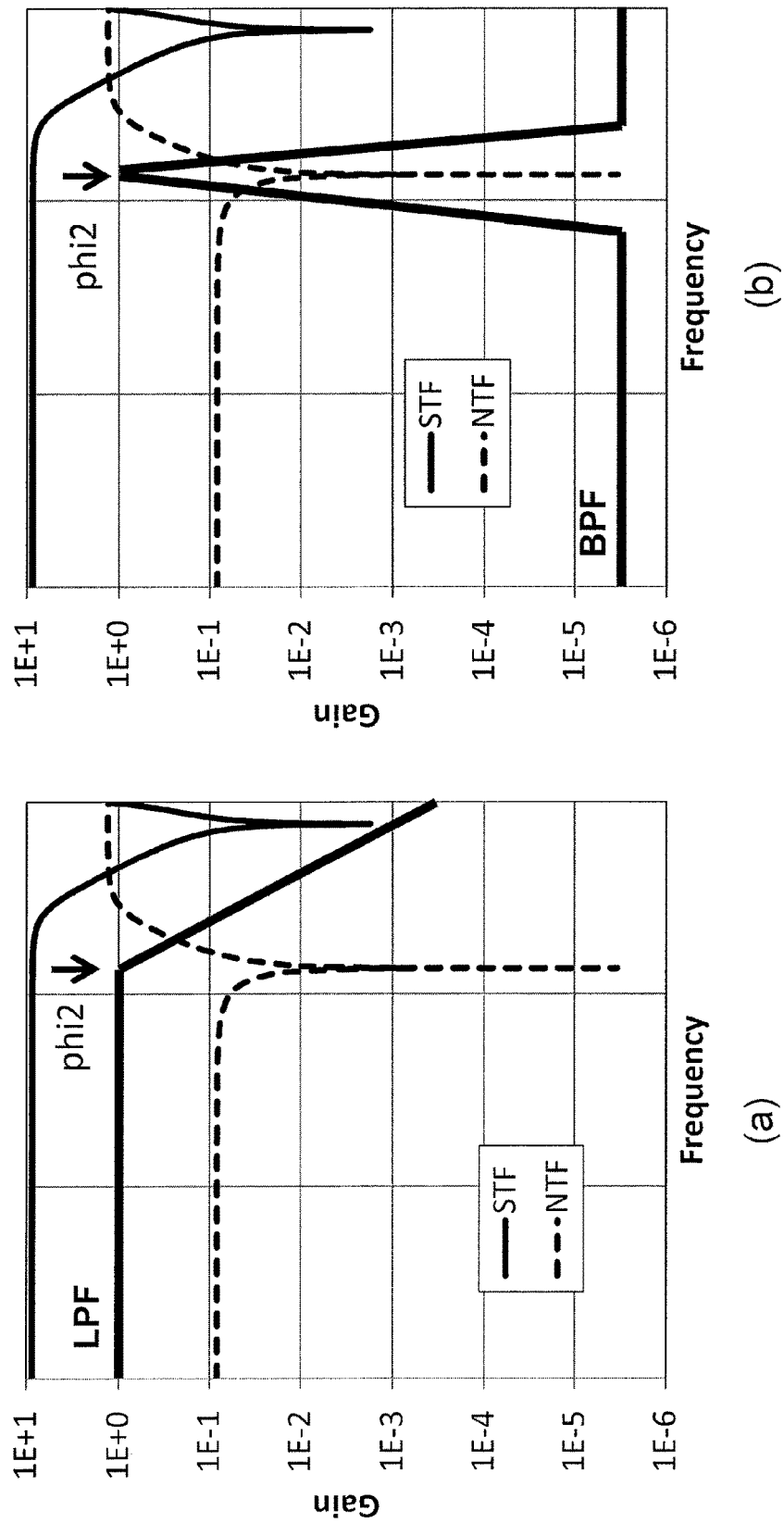
FIG. 17($a$) is a graph illustrating an example of an LPF through phi2 to remove higher frequencies than a frequency of phi2.

FIGS. 17(a) and 17(b) illustrate an example of frequency characteristics of a FILTER included in the circuit block SIGPROCESS performing amplification, digital conversion, and filter processing. FIG. 17(a) illustrates an example of a low-pass filter LPF and FIG. 17(b) illustrates an example of a band-pass filter BPF. When phi2 is a rectangular wave, since the spectrum of phi2 includes an odd multiple harmonic of the frequency of phi2, the quantization noise having the NTF intensity of the frequency corresponding to the odd multiple harmonic of phi2 is demodulated to the signal band at the time of demodulation. Since it is difficult to prevent this phenomenon in principle, it is a realistic measure to keep NTF intensity at a higher frequency than phi2 as small as possible before synchronous detection. Hence, it is ideal to transmit phi2 by 100%, and to remove a higher frequency side than phi2. FIGS. 17(a) and 17(b) illustrate examples designed as such. There are no particular restrictions on the order of the filter, but when LPF is implemented by downsampling, it is necessary to carefully design the mixing of aliasing noise. As can be seen from the figure, since the NTF of a general noise shaping type ADC increases on the high frequency side, cutting the increased NTF is indispensable for increasing the sensitivity of the sensor system.

As described above, when the contrivances in FIGS. 16 and 17 are applied to SIGPROCESS, the sensor signal based on the capacitance change obtained by the sampling type C/V circuit using the carrier wave modulated by phi1 and phi2 of the present invention system can be synchronously detected while maintaining an excellent signal/noise ratio (S/N ratio).

With the above configuration, the description of the first embodiment of the present invention is completed.

Second Embodiment

A second embodiment of the present invention will be described with reference to FIG. 18.

As compared to the first embodiment, only the carr generation circuit is different, and MODCARRGEN in FIG. 6 is replaced with a carrier generation circuit CARRGEN and a modulation circuit MOD. Phi1 generated by CLKGEN is input to CARRGEN. CARRGEN generates modinp and modinn having phases inverted from each other and having the same amplitude MAG from the input of phi1. The circuit of CARRGEN includes, as an example, one NOT gate and two output amplifiers that generate an analog signal having an amplitude MAG from a logic level phi1. The modulation circuit MOD receives modinp/n as an input and outputs the outputs carr and carrb modulated by phi2 and the inversion signal phi2b of phi2. The MOD includes, for example, four analog switches SW. When phi2="H", modinp and carr are connected to each other, and modinn and carrb are connected to each other. When phi2b="H", modinn and carr are connected to each other, and modinp and carrb are connected to each other. Since modinp and modinn each have an analog level MAG, it is necessary to design SW so as to perfectly pass the level of MAG. As an example, when a potential of MAG is high, it may be necessary to apply high voltage compatible MOS to SW and boost voltage by level conversion for phi2 and phi2b.

Figure 18:
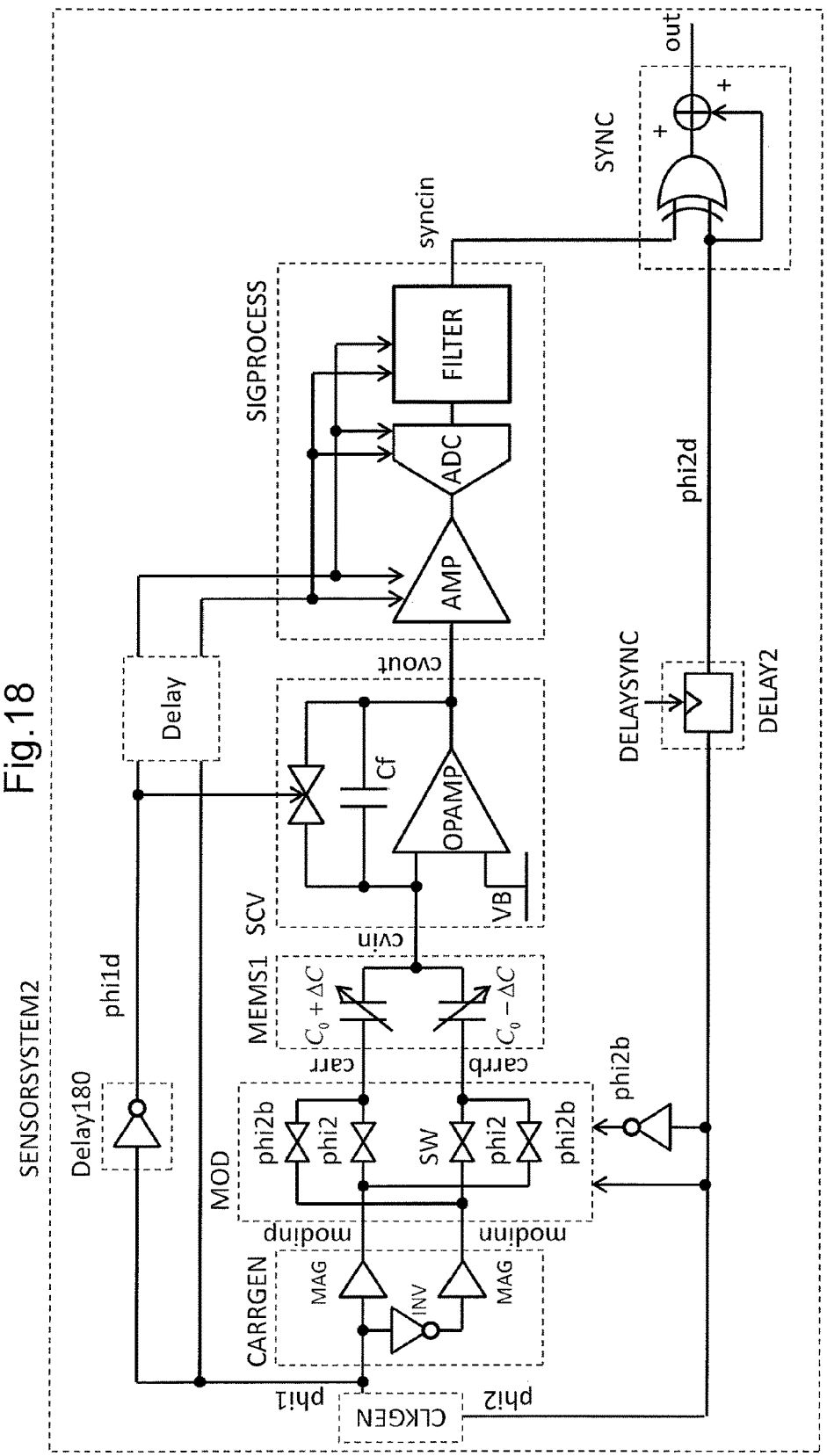
FIG. 18 is a circuit diagram illustrating a capacitance detection type sensor system using a modulated carrier wave according to a second embodiment.
Figure 19:
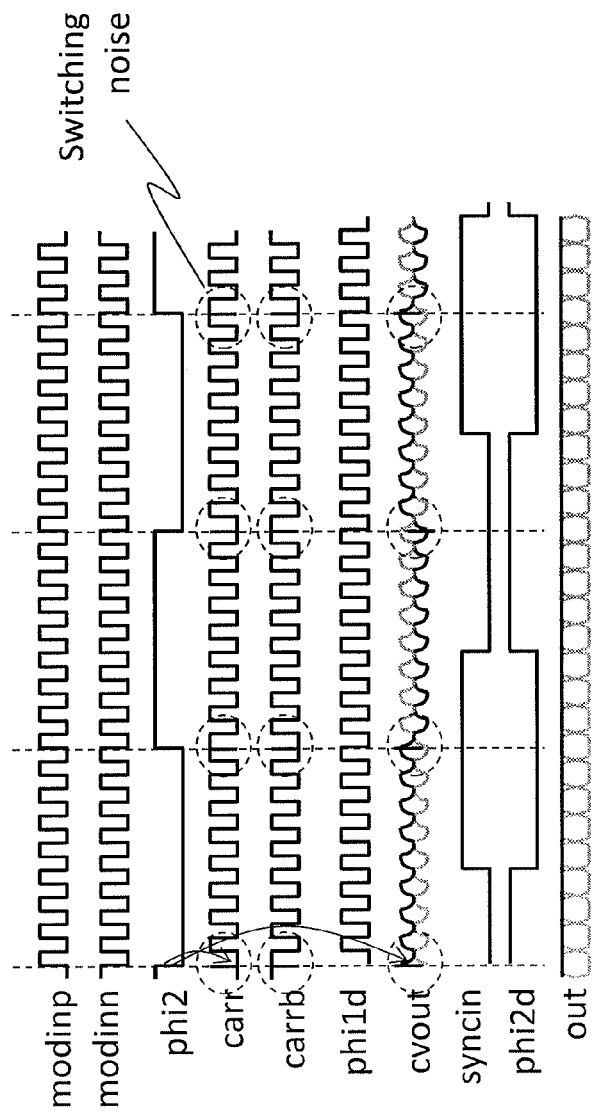
FIG. 19 is an operation waveform diagram of the second embodiment.

FIG. 19 illustrates operation waveforms of the circuit illustrated in FIG. 18. The phase relationship is reversed between modinp and modinn. When phi2="H", carr=modinp is met, and when phi2="L", carr=modinn is met. At that time, the carr has the same waveform as that of the carr illustrated in FIG. 10 which is the waveform diagram of the first embodiment. It is worth noting that since the connection between modinp and modinn is switched at the transition timing of phi2 as described above, switching noise occurs in portions indicated by dotted circles. However, because phi1d="L" is met at this timing, the C/V conversion circuit is in a reset state or at timing when switching to the reset state. In any case, the switching noise is not sampled together with the signal. Therefore, a highly sensitive sensor system can be realized as in the first embodiment.

The description of the second embodiment according to the present invention is completed above.

Third Embodiment

Hereinafter, in describing third, fourth, fifth, and sixth embodiments of the present invention, a sensor element MEMS2 to be applied will be described with reference to FIG. 20.

Figure 20:
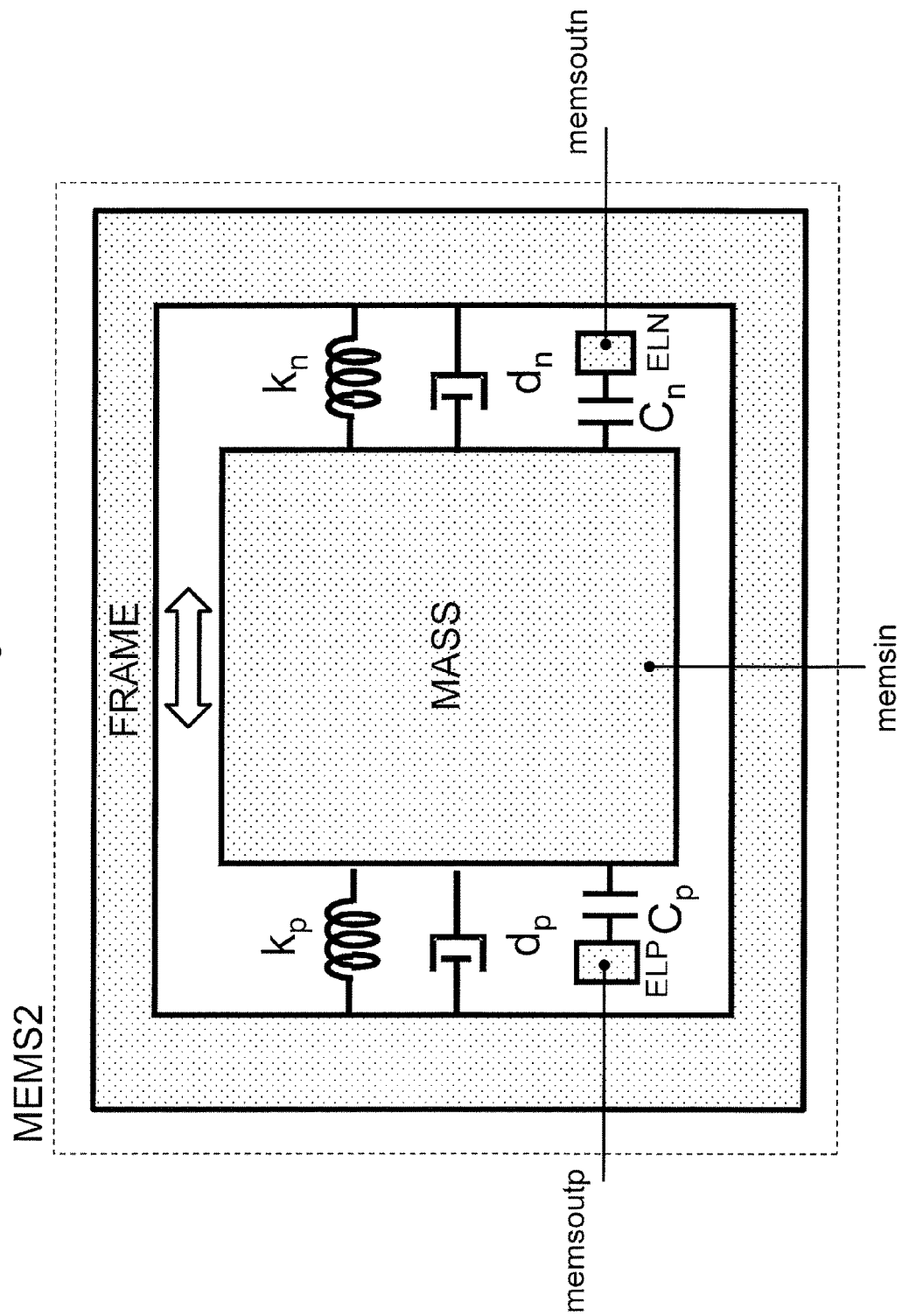
FIG. 20 is a top view of an example of a configuration example of a uniaxial acceleration sensor applied to a third to sixth embodiments.

As will FIG. 1, a sensor illustrated in FIG. 20 includes a frame FRAME, a movable mass MASS, springs kp and kn, dampers dp and dn, a positive side detection electrode ELP, a negative side detection electrode ELN, a positive side detection capacitance Cp, and a negative side detection capacitance Cn. However, an electric connection relationship is different from that in FIG. 1. In a MEMS2 illustrated in FIG. 20, a carrier wave is input to the MASS, and a charge fluctuation caused by a capacitance change is detected from memsoutp connected to ELP and memsoutn connected to ELN. Input and output are reversed as compared with FIG. 1.

Figure 21:
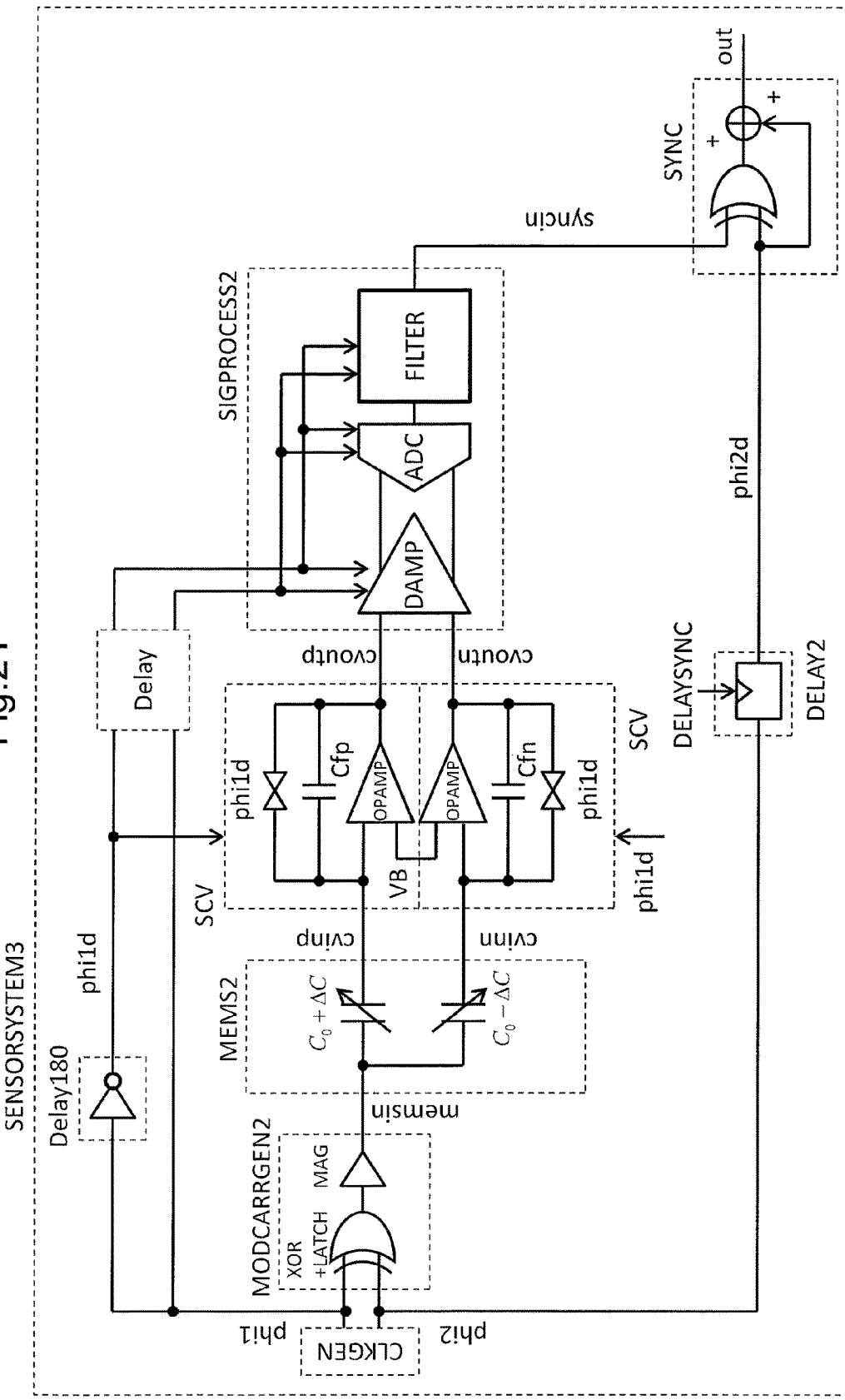
FIG. 21 is a circuit diagram illustrating a capacitance detection type sensor system using a modulated carrier wave according to the third embodiment.

The third embodiment according to the present invention will be described with reference to FIG. 21. Phi1 and phi2 generated by a clock generation circuit CLKGEN are input to the MEMS2 as a carrier wave memsin modulated through the modulated carrier generation circuit MODCARRGEN 2. In this example, DOMCARRGEN2 includes, as an example, one XOR gate and one amplifier which amplifies a carrier wave of the digital level to the analog level MAG. Unlike the first and second embodiments, there are two output terminals of the MEMS2, and those output terminals are input to the respective sampling C/V conversion circuit SCV. The two SCVs operate in the same manner as in the first and second embodiments in that those SCVs operate with the clock phi1d obtained by delaying phi1 by 180 degrees. In the system, if a gain of an operational amplifier OPAMP configuring the SCV is high, because cvinp and cvinn are stably settled to a reference voltage VB, stable C/V conversion can be realized. The outputs of the two SCVs are input to a circuit block SIGPROCESS2 which performs signal amplification, digital conversion, and filtering as cvoutp and cvoutn, respectively. The difference from SIGPROCESS illustrated in FIG. 6 resides in that the amplifier is a fully differential DAMP. A difference between cvoutp and cvoutn is amplified by the operation amplifier and input to the ADC. The other configurations are identical with those in the first and second embodiments.

Fourth Embodiment

Figure 22:
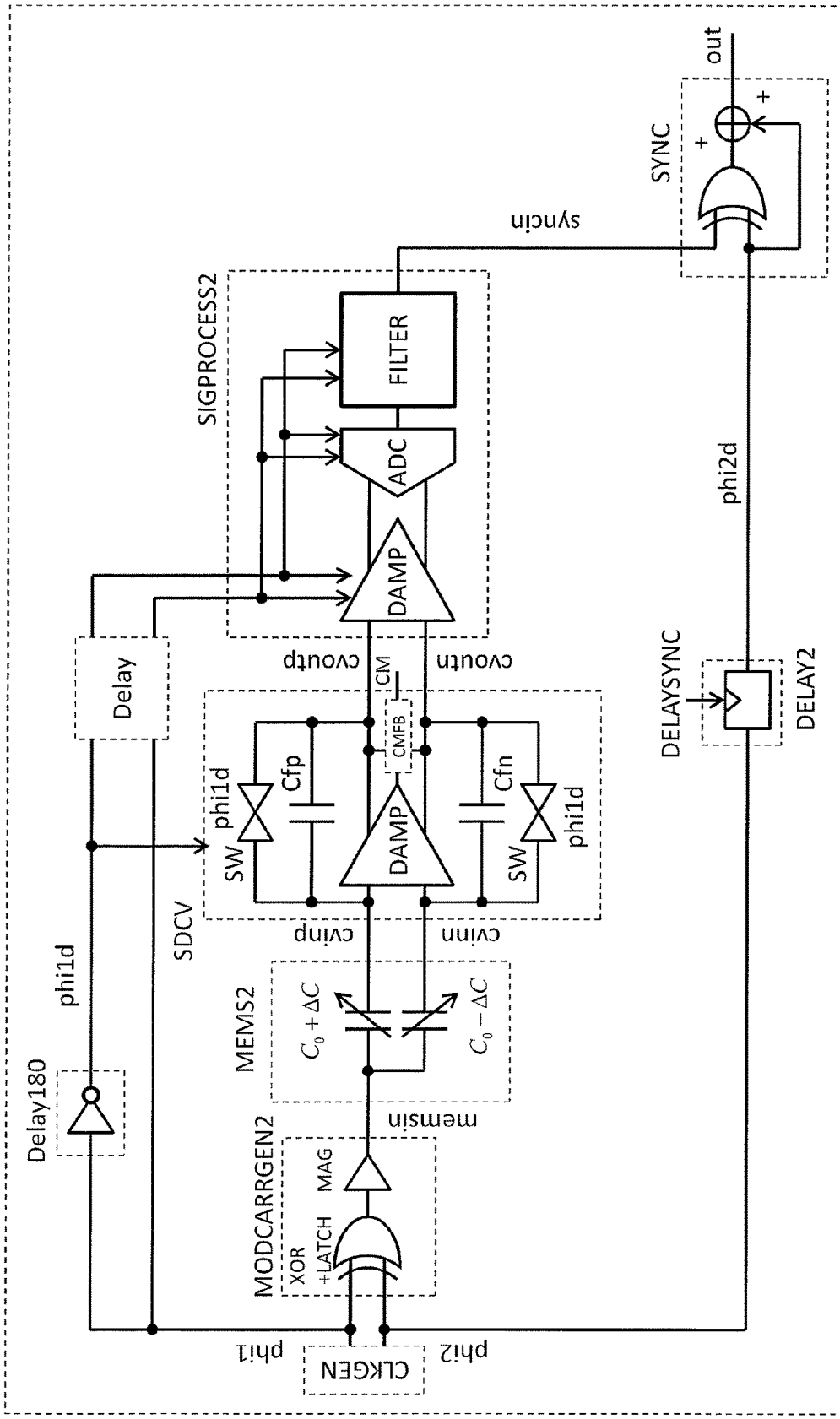
FIG. 22 is a circuit diagram illustrating a capacitance detection type sensor system using a modulated carrier wave according to a fourth embodiment.

FIG. 22 illustrates a fourth embodiment of the present invention. The fourth embodiment is different from the third embodiment in that the C/V conversion circuit is changed from two SCVs to one sampling type fully differential C/V conversion circuit SDCV. The SDCV typically includes one fully differential amplifier DAMP, two analog switches SW, two feedback capacitors Cfp and Cfn, and a common mode feedback circuit CMFB. A common mode potential CM is input to CMFB. With a replacement of two SCVs with one SDCV, the circuit can be downsized and a chip area can be reduced, leading to cost reduction. Also, with an appropriate design of CMFB, since the levels of cvinp and cvinn can be stably maintained at CM, the sensor sensitivity is not impaired.

Figure 23:
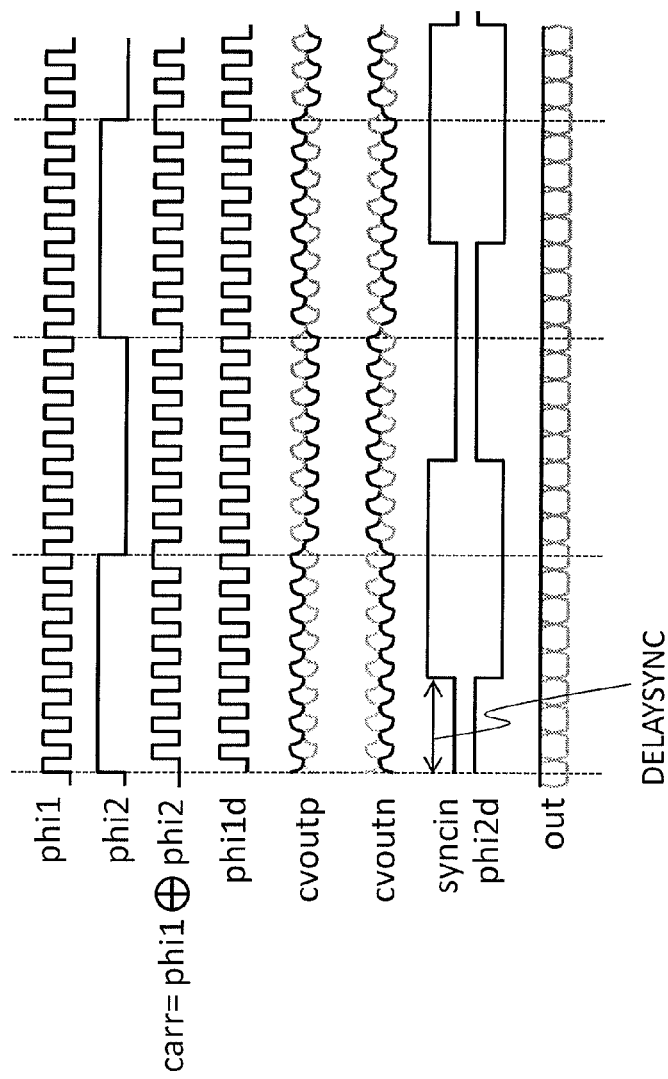
FIG. 23 is an operation waveform diagram of the third and fourth embodiments.

FIG. 23 illustrates internal waveforms of the circuits according to the third and fourth embodiments. The waveform example assumes that a positive constant value is input as an input physical quantity. Although the third and fourth embodiments have different circuit components, the operation waveforms are the same. Carr is generated by exclusive OP of phi1 and phi2. The amplitude of carr is amplified to MAG. An output charge of the MEMS2 is sampled by the C/V conversion circuit by phi1d, and the respective outputs are represented by cvoutp and cvoutn. The respective outputs are complementary, potentials in the reset state are VB in the third embodiment using SCV for the C/V conversion circuit, and CM in the fourth embodiment using SDCV. The output differentially amplified by SIGPROCESS2 is input to a synchronous detection circuit SYNC as syncin with a signal delay DELAYSYNC. Phi2 is demodulated by phi2d which is delayed by DELAYSYNC, and a positive constant output is obtained as out. As compared with the internal waveform of FIG. 10 in the first and second embodiments using MEMS1, cvout is output as complementary positive and negative signal.

Fifth Embodiment

Figure 24:
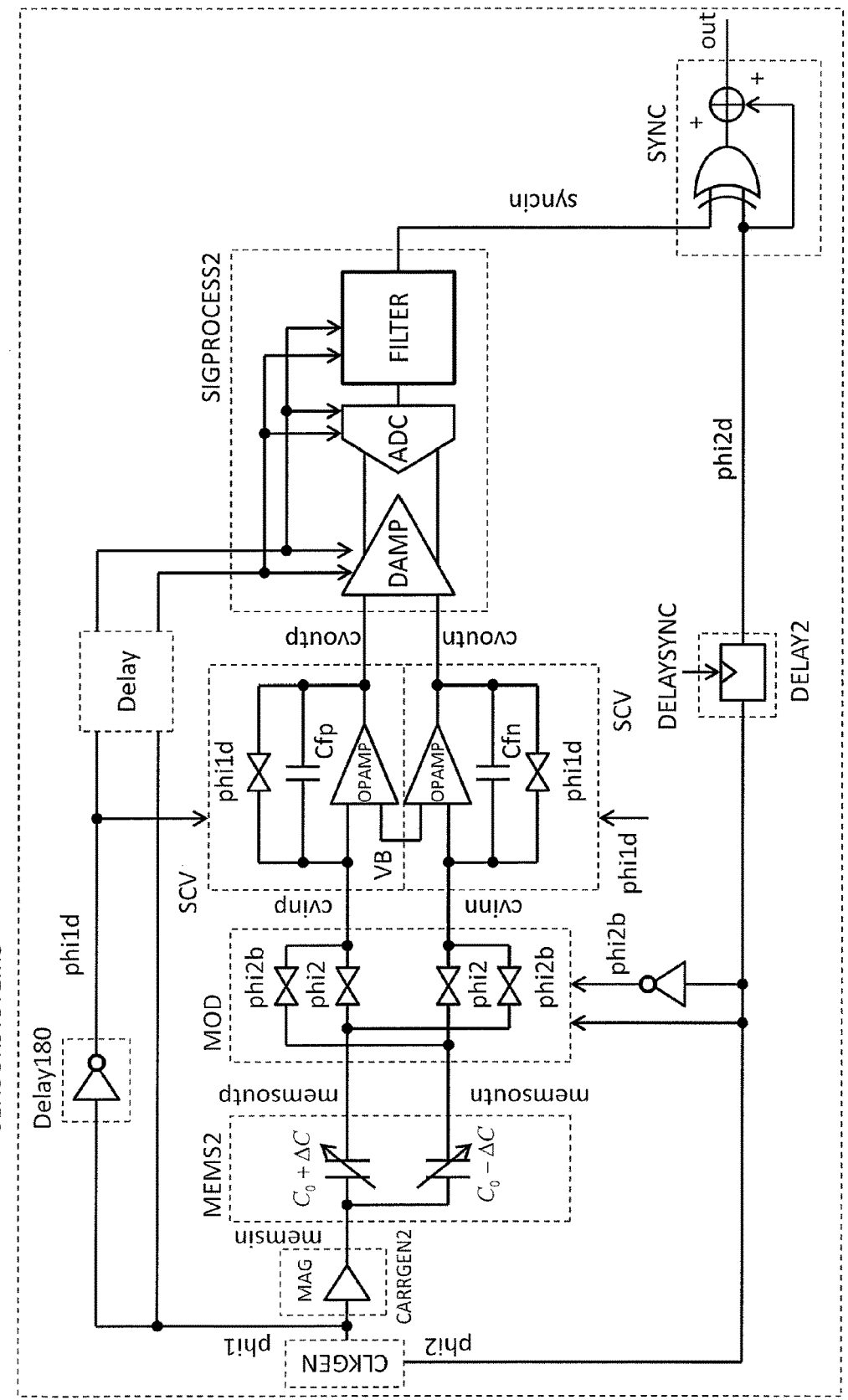
FIG. 24 is a circuit diagram illustrating a capacitance detection type sensor system using a modulated carrier wave according to a fifth embodiment.

A fifth embodiment of the present invention will be described with reference to FIG. 24. The fifth embodiment is different from the third embodiment in that the carrier wave input to the MEMS2 is not modulated, and the output of the MEMS 2 is modulated by phi2. The phi1 generated by the clock generation circuit CLKGEN is amplified to the analog amplitude MAG by the carrier generation circuit CARRGEN2 and input to the MEMS2. The outputs memsoutp and memsoutn of the MEMS2 are switched to cvinp and cvinn in a cycle of phi2 by the modulation circuit MOD. The configuration of the MOD may be the same as that illustrated in FIG. 18.

Sixth Embodiment

Figure 25:
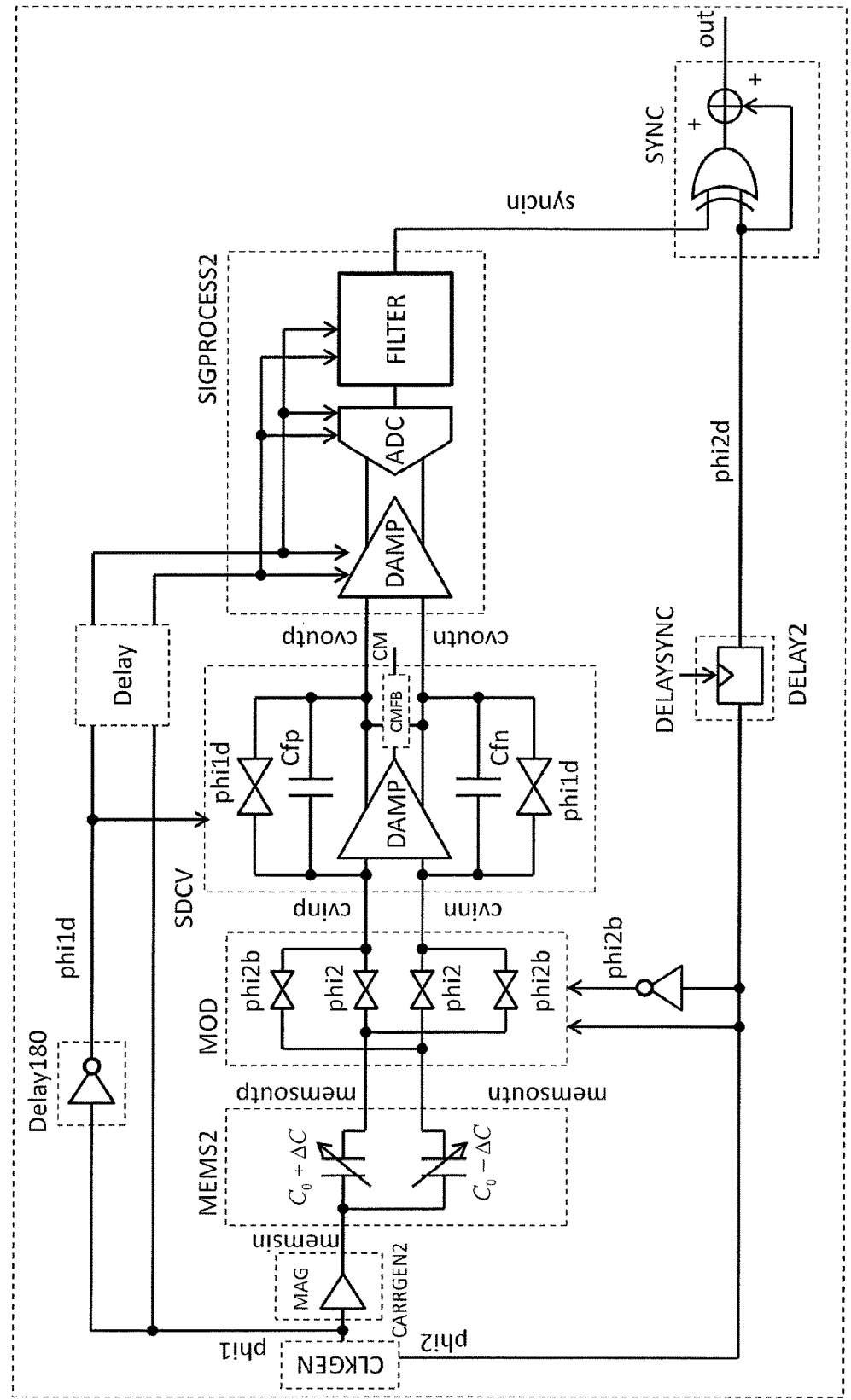
FIG. 25 is a circuit diagram illustrating a capacitance detection type sensor system using a modulated carrier wave according to a sixth embodiment.

A sixth embodiment according to the present invention will be described with reference to FIG. 25. In the fifth embodiment, two SCVs are replaced by one SDCV.

The third to sixth embodiments have an advantage that is more resistant to variations in the feedback capacitances Cfp and Cfn in the C/V conversion circuit than the conventional configuration. In the present specification, the conventional configuration represents a configuration in which the carrier wave is not modulated as in the third and fourth embodiments, or a configuration in which the carrier wave is not modulated by phi2, or the phi2 does not change the positive and negative outputs of the MEMS 2 as in the fifth and sixth embodiments. It refers to the composition. It is difficult to set Cfp and Cfn to be strictly equal to each other due to a manufacturing variation, and in that case, the gain of the C/V circuit varies between the positive side and the negative side, as a result of which a difference between Cfp and Cfn is superimposed on the signal as an offset. In the case of the conventional method, since the offset cannot be canceled to the end and can be an output of the sensor system, it has been necessary to remove the offset by a correction calculation. On the other hand, in the third and fourth embodiments, positive and negative MEMS 2 output signals are switched by inverting the carrier phase, and in the fifth and sixth embodiments, since the connection of memsout/n is switched by the switch. Therefore, both of Cfp and Cfn are used for amplification, thereby being capable of averaging Cfp and Cfn variations. The superimposed offset, can be completely eliminated by performing synchronous detection at the subsequent stage. Therefore, a need for offset correction calculation in the subsequent stage can be eliminated.

Internal waveforms of the circuits in the fifth and sixth embodiments will be described with reference to FIG. 26. The waveform example assumes that a positive constant value is input as an input physical quantity. The input carrier wave memsin to the MEMS 2 vibrates at the same frequency as phi 1 and has an analog amplitude MAG. When phi2="H", memsoutp and cvinp are connected to each other and memsoutn and cvinn are connected to each other. When phi2b="H", memsoutn and cvinp are connected to each other, and memsoutp and cvinn are connected to each other. The voltage levels of cvinp and cvinn are always fixed to VB (in the case of the fifth embodiment) or CM (in the case of the sixth embodiment) as long as the common mode feedback CMFB functions correctly. The cvoutp and cvoutn outputs change complementarity. A difference between cvoutp and cvoutn is synchronously detected with the use of phi2d given by an appropriate delay DELAYSYNC, to thereby obtain a positive constant output from out. It should be noted that switching noise occurs at switching timing of phi2. However, if the transition timing of phi2 is set when phi1d="L", that is, when the C/V conversion circuit is reset, superimposition of the switching noise on the signal can be avoided. Switching noise is generated spike-like in cvinp/n and cvoutp/n, but since the noise is superimposed on resetting, there is no adverse effect on the sensitivity of the sensor system.

The present invention is not limited to the above-described embodiments, but includes various modifications. For example, it is possible to replace a part of the configuration of one embodiment with the configuration of another embodiment, and the configuration of another embodiment can be added to the configuration of one embodiment. In addition, it is possible to add, delete, and replace the configurations of the other embodiments with respect to a part of the configuration of each embodiment.

INDUSTRIAL APPLICABILITY

Since the capacitance detection type sensor system according to the present invention can detect the accelerations and the angular velocities, the sound waves, the seismic waves, and the like on the low frequency side with high sensitivity, the capacitance detection type sensor system can be applied to a posture control for robots, unmanned vehicles, and radio controllers including vehicles such as automobiles, helicopters and ships, and a precise observation of sound waves and seismic waves, etc.

LIST OF REFERENCE SIGNS

MEMS1 capacitance detection type sensor 1
FRAME: frame

MASS: movable mass
kp: Positive side spring
kn: negative side spring
dp: positive side damper
dn: negative side damper
ELP: positive side detection electrode
ELN: negative side detection electrode
Cp: Positive side detection capacity
Cn: negative side detection capacity
memsinp: positive side MEMS input
memsinn: negative side MEMS input
memsout: MEMS output
C/V: C/V conversion circuit
AMP: amplifier
ADC: analog to digital conversion circuit
BW: effective bandwidth
phi1: first modulation frequency
LPF: low pass filter
fcorner: frequency at which the spectrum of 1/f noise and white noise intersects
phi2: second modulation frequency
PSD: power spectral density
phi2low: lower limit frequency of low phi2
MODCARRGEN: modulated carrier generation circuit
CLKGEN: clock generation circuit
SCV: sampling C/V conversion circuit
SENSORSYSTEM1: first configuration example of sensor system
Delay 180: 180 degree phase delay circuit
phi1$d$: clock with delayed phi1 by 180 degrees
MAG: carrier voltage and amplifier realizing the carrier voltage
INV: MOT gate
SW: analog switch
Cf: feedback capacitance
OPAMP: operational amplifier
XOR: Exclusive OR gate
LATCH: latch circuit
ΔC: capacitance change
C0: initial capacitance
phi1$d$2: clock with delayed phi1
Phi1$dd$2: clock with delayed phi1$d$
SIGPROCESS: signal processing circuit including amplifier, ADC, filter, etc.
FILTER: filter
DELAY2: delay circuit of phi2
DELAYSYNC: delay amount applied to DELAY2
phi2$d$: clock with delayed phi2
BITSYNC: 1-bit synchronous detection circuit
SYNC: n-bit synchronous detection circuit
DELAYALL: delay circuit including Delay, DELAY2, Delay180
POSTPROCESS: post-calculation circuit block for correction and adjustment
IF: transmit/receive interface for IF chip-to-chip communication
WCIF: interface for wireless communication
aveout: averaged sensor system output
gA: sensor system, output when using modulated carrier wave
g1A, g2 ($a$): sensor system, output in conventional configuration
g3($a$): sensor system output when phi1 is used for clock of C/V conversion circuit
phi2$d$90: clock with phi2 delayed by 90 degrees
STF: signal transfer function
NTF: noise transfer function
BPF: band pass filter
CARRGEN: carrier generation circuit
MOD: modulation circuit
modinp: modulation circuit positive side input
modinn: modulation circuit negative side input
memsoutp: MEMS2 positive side output
memsoutn: MEMS2 negative side output
memsin: MEMS2 input
SDCV: sampling type fully differential C/V conversion circuit
cvinp: positive side C/V conversion circuit input
cvinn: negative side C/V conversion circuit input

The invention claimed is:

1. A signal detection method for detecting a change of an electric capacitance of a capacitance detection type sensor, comprising:
receiving, at the sensor, a signal within a signal frequency bandwidth, the signal having electric charge information indicating the change in electric capacitance,
generating a carrier wave, used to transfer the signal to a circuit, at a first modulation frequency and a second modulation frequency lower than the first modulation frequency, each of the first modulation frequency and a second modulation frequency being greater than the signal frequency bandwidth;
transferring, to the circuit, the signal having the electric charge information indicating the change in the electric capacitance and modulated by the carrier wave;
sampling, at the circuit, the signal at the first modulation frequency;
converting, at the circuit, the signal having the electric charge information indicating the change in the electric capacitance into a second signal having electric charge information indicating a change in a voltage such that a frequency spectrum component of the signal at the first modulation frequency is changed to direct current (DC) while a frequency spectrum component of the signal at the first modulation frequency remains unchanged;
demodulating the second signal, having the electric charge information indicating the change in the voltage, with the second modulation frequency; and
applying a frequency filter to the demodulated signal to obtain a target frequency signal.

2. The signal detection method according to claim 1, wherein the frequency filter is a low-pass filter, and
the second modulation frequency is equal to or higher than a transmission frequency band of the low-pass filter.

3. The signal detection method according to claim 1, wherein the second modulation frequency is equal to or higher than a frequency obtained by adding a detection frequency bandwidth of the capacitance detection type sensor to a frequency bandwidth having a pink noise larger than a white noise of the signal detection method that processes the change signal of the capacitance detection type sensor, and equal to or lower than half of the first modulation frequency.

4. A micro-electro-mechanical system (MEMS) sensor for detecting a change of an electric capacitance, the sensor comprising:
a MEMS element configured to receive a signal within a signal frequency bandwidth, the signal having electric charge information indicating the change in electric capacitance;
a carrier generation circuit that generates a carrier wave, used to transfer the signal from the MEMS element, at a first modulation frequency and a second modulation frequency lower than the first modulation frequency, each of the first modulation frequency and a second modulation frequency being greater than the signal frequency bandwidth; and a switched capacitor type capacitance to voltage (CV) conversion circuit configured to:
sample the signal from the MEMS element with a clock at the first modulation frequency; and
convert the signal transferred from the MEMS element into a second signal having electric charge information indicating a change in a voltage such that a frequency spectrum component of the signal at the first modulation frequency is changed to direct current (DC) while a frequency spectrum component of the signal at the first modulation frequency remains unchanged.

5. The MEMS sensor according to claim 4, further comprising an amplifier configured to amplify the second signal from the switched capacitor type CV conversion circuit.

6. The MEMS sensor according to claim 5, further comprising an A/D converter that subjects a signal from the amplifier to A/D conversion which is disposed at a subsequent stage of the amplifier.

7. The MEMS sensor according to claim 6, further comprising a filter configured to remove a frequency component higher than the second modulation frequency, which is disposed at a subsequent stage of the A/D converter.

8. The MEMS sensor according to claim 7, further comprising a demodulator that demodulates an output from the filter with the use of the second modulation frequency.

9. The MEMS sensor according to claim 4,
wherein the first modulation frequency is shifted in phase from the clock by 180 degrees.

10. The MEMS sensor according to claim 9,
wherein the second modulation frequency is 0.5 times of the first modulation frequency.

11. The MEMS sensor according to claim 6,
wherein the A/D converter is designed such that a quantization noise intensity becomes a minimum value at the second modulation frequency.

12. A micro-electro-mechanical system (MEMS) sensor system for detecting a change of an electric capacitance, the sensor system comprising:
a MEMS element configured to receive a signal within a signal frequency bandwidth, the signal having electric charge information indicating the change in electric capacitance;
a carrier generation circuit that generates a carrier wave, used to transfer the signal from the MEMS element, at a first modulation frequency;
a conversion circuit configured to:
sample the signal transferred from the MEMS element with a first clock signal at the first modulation frequency; and
convert the signal transferred from the MEMS element into a second signal having electric charge information indicating a change in a voltage such that a frequency spectrum component of the signal at the first modulation frequency is changed to direct current (DC) while a frequency spectrum component of the signal at the first modulation frequency remains unchanged;
an amplifier configured to amplify the second signal;
an A/D converter configured to convert the second signal to a digital second signal;
a low-pass filter configured to filter the digital second signal; and
a demodulation circuit configured to demodulate the filtered digital second signal at a second modulation frequency lower than the first modulation frequency, each of the first modulation frequency and the second modulation frequency being greater than the signal frequency bandwidth,
wherein:
the carrier wave is further modulated according to the second modulation frequency; or
the signal from the MEMS element is modulated according to the second modulation frequency and the modulated signal is input to the conversion circuit.

13. The MEMS sensor system according to claim 12,
wherein the carrier generation circuit includes a logic circuit comprising:
two inputs configured to receive the signal from the MEMS element modulated at the first modulation frequency and either the carrier wave modulated according to the second modulation frequency or the signal from the MEMS element modulated according to the second modulation frequency; and
two outputs configured to output two output signals based on the logic circuit,
the MEMS element includes:
two variable capacitors configured to receive the two output signals from the carrier generation circuit; and
one output terminal connected to the two variable capacitors, and
the conversion circuit samples a signal from the output terminal of the MEMS element according to the first clock signal, which is different in phase from the first modulation frequency.

14. The MEMS sensor system according to claim 12,
wherein the carrier generation circuit includes:
a logic circuit having two inputs configured to receive the signal from the MEMS element modulated at the first modulation frequency and either the carrier wave modulated according to the second modulation frequency or the signal from the MEMS element modulated according to the second modulation frequency, and
an output configured to output one output signal based on the logic circuit,
the MEMS element includes:
two variable capacitors configured to receive the one output signal from the carrier generation circuit and
two output terminals connected to the respective two variable capacitors configured to provide two outputs, and
the conversion circuit include:
two sampling C/V conversion circuits or one sampling differential C/V conversion circuit configured to sample the two outputs from the two output terminals of the MEMS element according to the first clock signal, which is different in phase from the first modulation frequency.

15. The MEMS sensor system according to claim 12,
wherein the carrier generation circuit outputs one output signal based on the first modulated frequency,
the MEMS element includes:
two variable capacitors configured to receive the one output signal from the carrier generation circuit; and
two output terminals that are connected to the two variable capacitors, the MEMS sensor system further comprises a modulation circuit
configured to modulate outputs from the two output terminals at the second modulation frequency, and
the conversion circuit includes two sampling C/V conversion circuits or one sampling type fully differential C/V conversion circuit configured to sample the outputs from the two output terminals of the conversion circuit according to the first clock signal, which is different in phase from the first modulation frequency.

* * * * *